(12) United States Patent
Masuda

(10) Patent No.: US 9,818,981 B2
(45) Date of Patent: Nov. 14, 2017

(54) ORGANIC LIGHT-EMITTING DEVICE AND ORGANIC DISPLAY APPARATUS

(71) Applicant: Panasonic Intellectual Property Management Co., Ltd., Osaka (JP)

(72) Inventor: Hiroyuki Masuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 76 days.

(21) Appl. No.: 14/948,280

(22) Filed: Nov. 21, 2015

(65) Prior Publication Data

US 2016/0190514 A1 Jun. 30, 2016

(30) Foreign Application Priority Data

Dec. 24, 2014 (JP) .................. 2014-260253

(51) Int. Cl.
*H01L 51/52* (2006.01)
*H01L 27/32* (2006.01)

(52) U.S. Cl.
CPC ...... *H01L 51/5259* (2013.01); *H01L 51/5246* (2013.01); *H01L 51/5268* (2013.01); *H01L 27/3246* (2013.01); *H01L 51/5275* (2013.01); *H01L 51/5281* (2013.01); *H01L 2251/5315* (2013.01); *H01L 2251/558* (2013.01)

(58) Field of Classification Search
CPC ............. H01L 51/5259; H01L 51/5281; H01L 2251/558
See application file for complete search history.

(56) References Cited

U.S. PATENT DOCUMENTS

2007/0116896 A1* 5/2007 Shylo .................. G02B 5/0242
428/1.1
2007/0190291 A1* 8/2007 Kitahara ................ B32B 27/00
428/157
2008/0055523 A1* 3/2008 Nishihara ......... G02F 1/133504
349/96

(Continued)

FOREIGN PATENT DOCUMENTS

JP 2006-228519 8/2006
JP 2006-272190 * 10/2006 ............. B01D 53/26

(Continued)

OTHER PUBLICATIONS

Machine translation, Yamamoto, Japanese Pat. Pub. No. JP 2009-283154, translation date: Apr. 1, 2017, Espacenet, all pages.*

(Continued)

*Primary Examiner* — Victoria K Hall
(74) *Attorney, Agent, or Firm* — Greenblum & Bernstein, P.L.C.

(57) ABSTRACT

A display panel includes an EL panel part, a CP panel part, and a resin layer. Light is extracted from a luminous part including an organic luminous layer in the EL panel part in a direction of an arrow. The CP panel part includes a circular polarizing film. The resin layer is formed to cover an upper surface of the EL panel part, has a layer thickness of 15 μm, and includes a resin part and a plurality of getter particles dispersed in the resin part. The getter particles are dispersed at a density at which the getter particles do not overlap one another in plan view.

7 Claims, 19 Drawing Sheets

(56) References Cited

U.S. PATENT DOCUMENTS

| | | | | |
|---|---|---|---|---|
| 2008/0123031 A1* | 5/2008 | Homma | ................ | G02B 5/0221 349/112 |
| 2009/0086506 A1* | 4/2009 | Okumura | ............. | G02B 6/0041 362/613 |
| 2009/0103328 A1* | 4/2009 | Iwasaki | ................ | G02B 6/0041 362/617 |
| 2009/0115998 A1* | 5/2009 | Okumura | ................ | G01N 21/31 356/73 |
| 2010/0080019 A1* | 4/2010 | Iwasaki | ................ | G02B 6/0091 362/628 |
| 2013/0249384 A1* | 9/2013 | Sawabe | ................ | H01L 51/524 313/504 |
| 2014/0002901 A1* | 1/2014 | Kishi | ................... | G02B 5/0221 359/488.01 |
| 2014/0002904 A1* | 1/2014 | Kishi | ................... | G02B 5/0221 359/601 |
| 2014/0126064 A1* | 5/2014 | Kishi | ................... | G02B 5/0278 359/601 |

FOREIGN PATENT DOCUMENTS

| | | | | |
|---|---|---|---|---|
| JP | 2006-272283 | * | 10/2006 | ............. B01D 53/04 |
| JP | 2009-259656 | * | 11/2009 | ............. H05B 33/04 |
| JP | 2009-283154 | * | 12/2009 | ............. H05B 33/04 |

OTHER PUBLICATIONS

Machine translation, Shiraishi, Japanese Pat. Pub. No. JP 2006-272283, translation date: Apr. 1, 2017, Espacenet, all pages.*
Machine translation, Toyoda, Japanese Pat. Pub. No. JP 2006-272190, translation date: Apr. 1, 2017, Espacenet, all pages.*
Machine translation, Chisaka, Japanese Pat. Pub. No. JP 2009-259656, translation date: Apr. 1, 2017, Espacenet, all pages.*
Machine translation, Tanaka, Japanese Pat. Pub. No. JP 2006-228519, translation date: Mar. 30, 2017, Espacenet, all pages.*

* cited by examiner

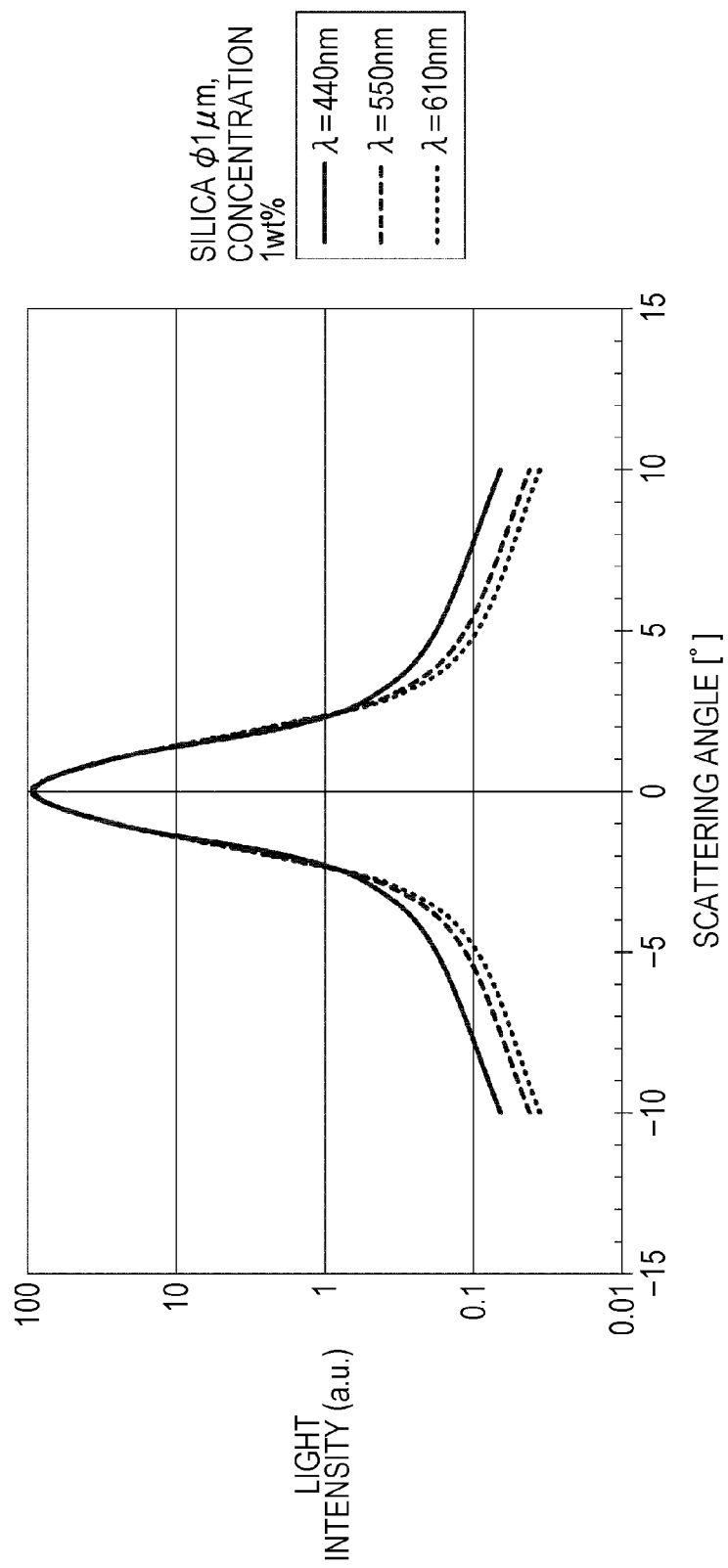

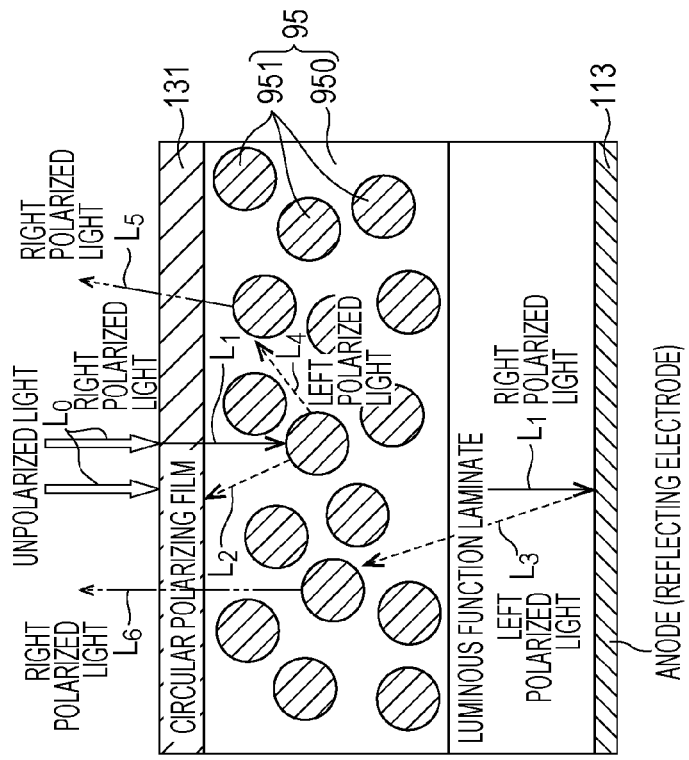
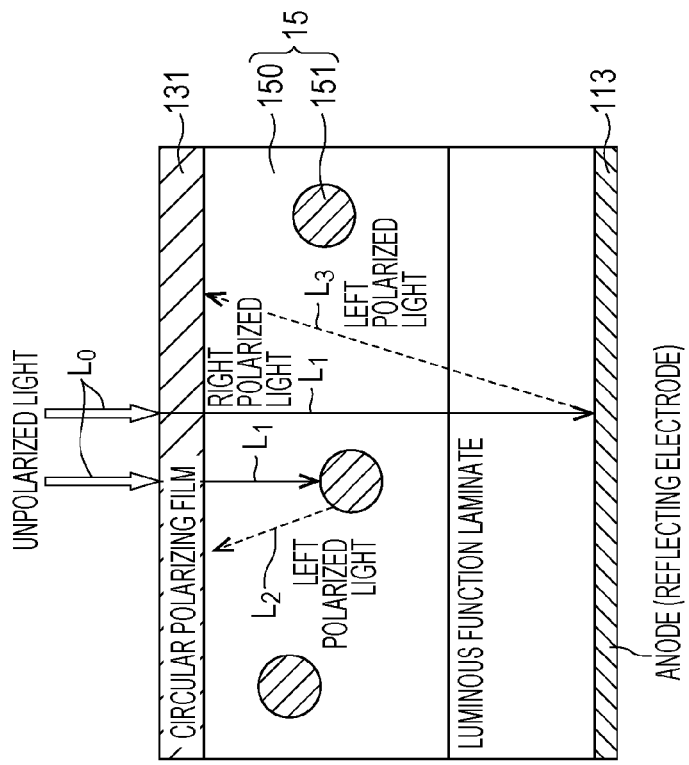

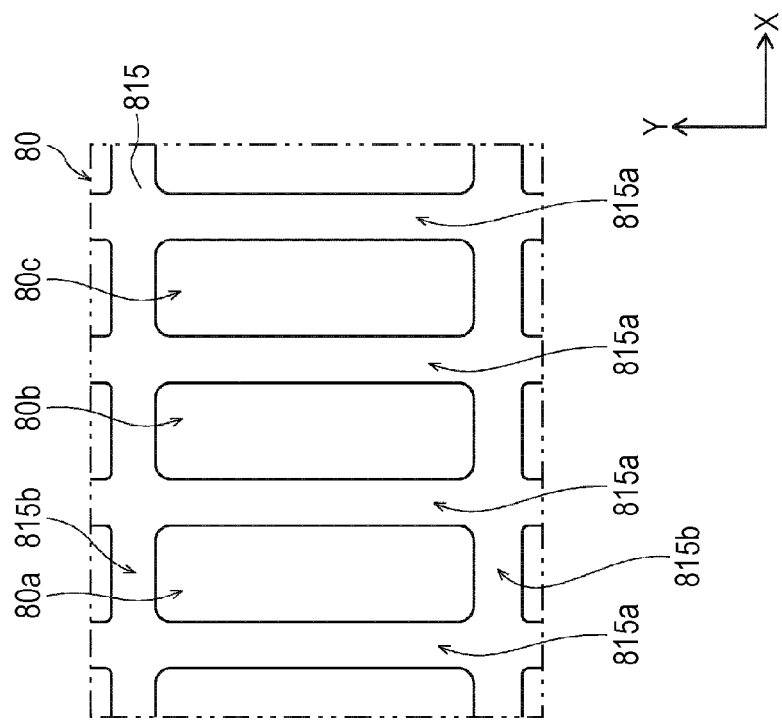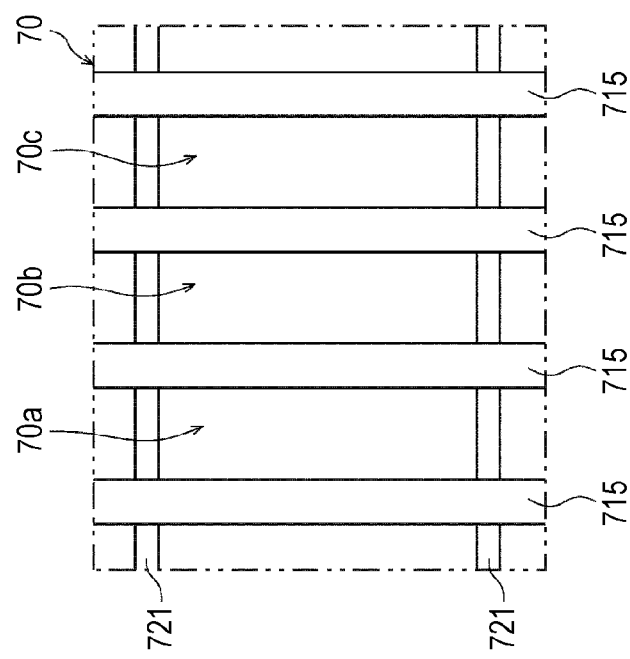

ORGANIC LIGHT-EMITTING DEVICE AND ORGANIC DISPLAY APPARATUS

BACKGROUND

1. Technical Field

The present disclosure relates to an organic light-emitting device and an organic display apparatus, and in particular to a structure of a resin layer disposed to cover a luminous part.

2. Description of the Related Art

In recent years, organic light-emitting devices, such as an organic EL (electro-luminescence) panel and organic EL lighting, have been intensively developed.

An organic EL panel includes a first panel part in which an EL luminous part is formed and a second panel part disposed so as to face the first panel part with a gap between the first panel part and the second panel part. The first panel part and the second panel part are joined by a resin layer inserted between the first panel part and the second panel part.

The first panel part has a structure including a TFT layer, a flat layer (insulating layer), an electrode, an organic luminous function layer, and an electrode laminated in this order on a substrate, and a sealing layer coating these layers. The resin layer covers the sealing layer of the first panel part.

An organic layer included in a structure of the organic light-emitting device, such as an organic EL panel, is susceptible to entry of substances such as water and oxygen from outside, and to outgas (various kinds of gas including water and oxygen) emitted from components after the panel is completed. This may produce a nonluminous region, such as a dark spot, and cause decline in light emission efficiency.

Patent Literature 1 discloses a technique to disperse particles (getter particles) that absorb gas, such as water, in the resin layer inserted between the first panel part and the second panel part, thereby inhibiting substances, such as water and oxygen, from entering a region where the organic layer is formed, and protecting the organic layer.

CITATION LIST

Patent Literature

PTL 1: Unexamined Japanese Patent Publication No. 2006-228519

However, employing the structure disclosed in Patent Literature 1 leads to existence of the getter particles between the first panel part including the organic luminous layer and the second panel part from which light is extracted. In a case where the resin layer is used in which the getter particles are dispersed in this way, external light incident from the second panel part side may be scattered by the getter particles, and the scattered light may pass through the second panel part and be emitted outward.

SUMMARY

In a case where the light scattered by the getter particles is emitted outward in this way, a cloudy phenomenon (haze) occurs, which leads to degradation in visibility and contrast in a well-lighted place.

One non-limiting and exemplary embodiment provides an organic light-emitting device and an organic display apparatus capable of achieving a securing of high visibility and an inhibition of a decline in contrast in a dark place, in a device structure where emitted light passes through a coating layer and is extracted outward, by inhibiting occurrence of a cloudy phenomenon even when external light enters, while inhibiting functional degradation of the organic layer under influence of substances such as water and oxygen that enter from outside, and outgas.

In one general aspect, the techniques disclosed here feature an organic light-emitting device including a first panel, a second panel, and a coating layer. The first panel and the second panel are disposed face-to-face with a gap between the first panel and the second panel. The coating layer is inserted between the first panel and the second panel so as to contact the first panel and the second panel.

The first panel according to the present aspect includes a first substrate and a luminous part. The luminous part formed on one of main surfaces of the first substrate includes an organic layer in structure and emits light opposite to the first substrate.

The second panel according to the present aspect includes a second substrate and a circular polarizing film. The circular polarizing film is disposed in a region through which the light emitted from the luminous part of the first panel passes.

The coating layer includes a resin part that transmits the light emitted from the luminous part and a plurality of particles dispersed in at least some region of the resin part. Each of the plurality of particles dispersed in the coating layer is formed of a material selected from the group consisting of synthetic zeolite, aluminum oxide, calcium chloride, calcium oxide, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride.

When a particle size parameter is plotted on a horizontal axis and scattering efficiency is plotted on a vertical axis, an average particle size D50 of the plurality of particles according to the present aspect is set in a range equal to or greater than a value of the particle size parameter at which the scattering efficiency becomes maximum.

A layer thickness of the coating layer according to the present aspect is not less than 10 μm and not more than 20 μm. The plurality of particles in the resin part are dispersed at a density at which the particles do not overlap one another when the second panel is viewed in plan view.

In the organic light-emitting device according to the above aspect, the layer thickness of the coating layer and the dispersion density of the plurality of particles are specified as described above. Accordingly, incident external light applied to the particles undergoes single scattering, and the scattered light is blocked from outward emission by the circular polarizing film of the second panel.

Therefore, the organic light-emitting device according to the above aspect is capable of achieving a securing of high visibility and an inhibition of a decline in contrast in a dark place, in the device structure where emitted light passes through the coating layer and is extracted outward, by inhibiting occurrence of a cloudy phenomenon even when external light enters, while inhibiting functional degradation of the organic layer under influence of substances such as water and oxygen that enter from outside, and outgas.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 9 is a graph illustrating a relationship between a scattering angle and light intensity for each wavelength of the light;

FIG. 13A is a schematic diagram illustrating how light travels in a case where resin layer 15 according to the exemplary embodiment is employed;

FIG. 13B is a schematic diagram illustrating how light travels in a case where resin layer 95 according to a comparative example is employed;

FIG. 20A is a schematic plan view illustrating arrangement of first banks 715 and second banks 721 in display panel 70 according to First variation; and FIG. 20B is a schematic plan view illustrating arrangement of bank 815 in display panel 80 according to Second variation.

DETAILED DESCRIPTION OF THE EMBODIMENTS

[Underlying Knowledge Forming Basis of Each Aspect of the Present Disclosure]

The present inventor has made the following studies in a process of perceiving each aspect of the present disclosure.

First, as in a technique disclosed in the above-described Patent Literature 1, dispersing getter particles in a resin layer (coating layer) inserted between panels is effective in protecting an organic layer from substances such as water that enters from outside.

However, in a case of dispersing the getter particles as described above in the resin layer that serves as a path for light from an organic luminous layer, it is necessary to control light scattering in addition to hygroscopicity by the getter particles to minimize inhibition of light transmission.

The present inventor has studied a relationship between a particle size of the getter particles, and transmittance and hygroscopicity, and has concluded it is preferable that the getter particles have larger particle size.

When the particle size of the getter particles is equivalent to or not less than a visible light wavelength, light of the visible light wavelength is Mie-scattered by the getter particles. A probability of the light of the visible light wavelength being scattered by the getter particles is proportional to a scattering sectional area, except for a case where a particle concentration is high and multiple scattering occurs. Therefore, the scattering probability is determined by the scattering sectional area per one particle and a number of particles. When the concentration of the getter particles per unit volume is identical, the number of particles decreases as the particle size of the getter particles is larger. Accordingly, a product of the scattering sectional area per one particle and the number of particles becomes smaller, and the scattering probability can be reduced.

Figure 1:
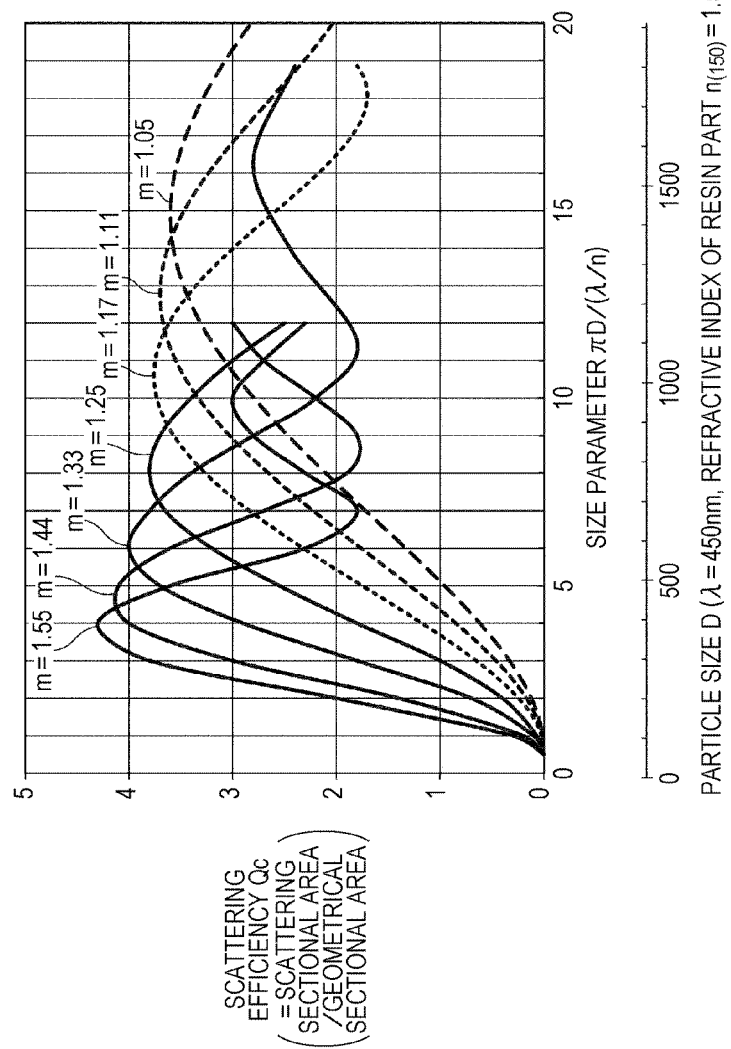
FIG. 1 is a graph illustrating scattering efficiency Qc of getter particles.

FIG. 1 is a graph illustrating a simulation result of scattering efficiency Qc (=scattering sectional area/geometrical sectional area) per one getter particle. It is known from Mie theory that the scattering efficiency Qc is dependent on a ratio of a visible light wavelength $\lambda$ to a particle size D ($\pi D/(\lambda/n_{(150)})$, a size parameter (particle size parameter; $\pi D/(\lambda/n)$), and a ratio ($m=m_r+im_i$) of a refractive index $n_{(151)}$ of the getter particle to a refractive index $n_{(150)}$ of the resin part. In FIG. 1, the refractive index $n_{(150)}=1.52$ and the wavelength $\lambda=450$ nm of the resin part are used as an example.

The refractive index $n_{(150)}$ of the resin part used as a sealing resin is typically "1.3 to 1.6" in many cases. In contrast, the refractive index $n_{(151)}$ of the getter particle that has a function as a getter material is typically "1.4 to 2.0" in many cases. Therefore, a combination of "1.0 to 1.5" is a typical value of m. Here, an absorption component $m_i$ is "0".

As illustrated in FIG. 1, in a size equivalent to or not less than the size of the particle with which Mie-scattering occurs, the scattering efficiency Qc shows magnitude of approximately "1 to 5", and approaches approximately "2" gradually as the particle size D increases. In a case where the absorption component $m_i$ is not "0", the scattering efficiency Qc becomes smaller on the whole, and approaches magnitude of approximately "1 to 2" gradually as the particle size D increases.

Figure 2A:
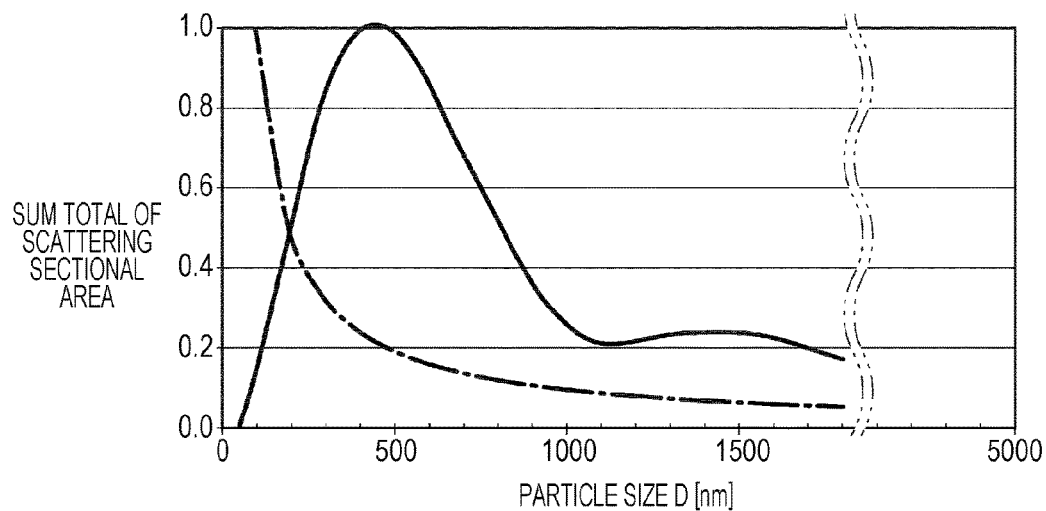
FIG. 2A is a graph illustrating a relationship between a sum total of scattering sectional area per unit volume and a particle size.
Figure 2B:
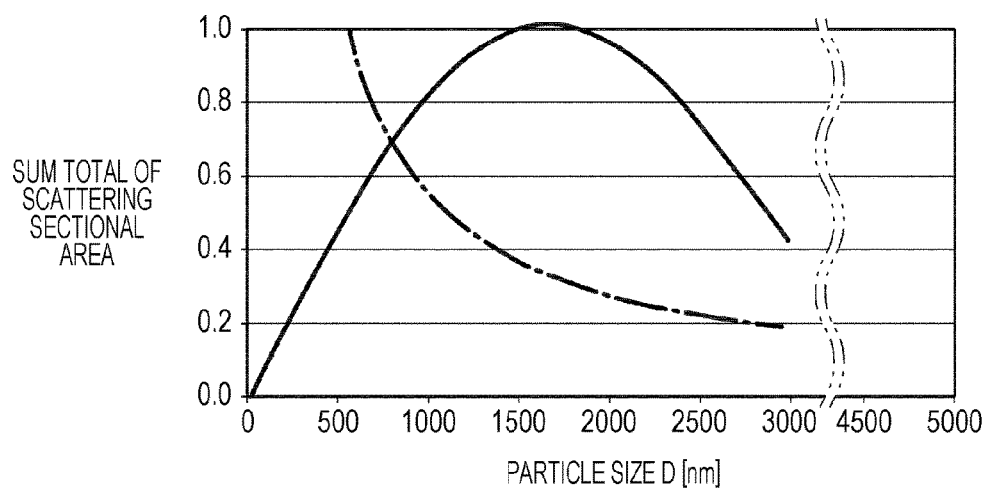
FIG. 2B is a graph illustrating a relationship between a sum total of scattering sectional area per unit volume and a particle size.

Next, FIG. 2A and FIG. 2B are graphs each illustrating a sum total of scattering sectional area per unit volume. The sum total of scattering sectional area is proportional to a loss caused by scattering of light per unit volume, and is a product of the scattering sectional area per one getter particle and the number of particles per unit volume.

FIG. 2A illustrates a simulation result when the refractive-index ratio m of the refractive index of the getter particle to the refractive index of the resin part is "1.33". FIG. 2B illustrates a simulation result when the refractive-index ratio m is "0.97". Note that a solid line in FIG. 2B is obtained by smoothing out data of a dashed line.

As illustrated in FIG. 2A and FIG. 2B, since the number of particles decreases as the particle size D increases, when it is assumed that the scattering sectional area is identical to the geometrical sectional area (Qc=1), a curved line is obtained in an inverse proportion to the particle size D as illustrated by a dot-dash line. This graph indicates that, in a range where the particle size D is equivalent to or not less than the wavelength, the scattering efficiency Qc is attenuated as the particle size D increases, and thus the sum total of the scattering sectional area per unit volume decreases as the particle size D increases.

FIG. 2A illustrates a range of the particle size D of up to approximately 2000 nm, and FIG. 2B illustrates a range of the particle size D of up to approximately 3000 nm. However, it is considered that the sum total of the scattering sectional area tends to converge when the particle size D is at least approximately 5000 nm.

Even when the particle size D is equivalent to or not larger than the wavelength, the scattering sectional area decreases, and in particular, in a range where the particle size D is 100 nm or less, the scattering sectional area becomes so small as to be negligible. This range is called a Rayleigh scattering range. For such extra-fine particles, the scattering efficiency Qc increases inversely with the wavelength $\lambda$ to the power of four, and wavelength dependence becomes stronger. Accordingly, when such extra-fine particles are employed in a display device such as an organic EL device, blue color having a short wavelength is scattered more, which causes a color imbalance in blue (B), green (G), and red (R). Accordingly, it is inappropriate to use such extra-fine particles in the display device.

As described above, each aspect of the present disclosure is based on that the scattering probability of light decreases as the particle size D increases, in a range where Mie-scattering occurs with the particle size of the getter particles equal to or larger than a half wavelength of the visible light wavelength.

Next, in an attempt to employ the getter particles having a large particle size, it is considered that the getter particles may inflict damage on an organic functional layer during lamination of a first panel and a second panel. The damage inflicted on the organic functional layer prevents securing light emission performance, and may cause a short circuit in some cases.

From a result of the aforementioned studies, each of the following aspects will be provided.

[Aspects of the Present Disclosure]

In one general aspect, the techniques disclosed here feature an organic light-emitting device including a first panel, a second panel, and a coating layer. The first panel and the second panel are disposed face-to-face with a gap between the first panel and the second panel. The coating layer is inserted between the first panel and the second panel so as to contact the first panel and the second panel.

The first panel according to the present aspect includes a first substrate and a luminous part. The luminous part formed on one of main surfaces of the first substrate includes an organic layer in structure and emits light opposite to the first substrate.

The second panel according to the present aspect includes a second substrate and a circular polarizing film. The circular polarizing film is disposed in a region through which the light emitted from the luminous part of the first panel passes.

The coating layer includes a resin part that transmits the light emitted from the luminous part and a plurality of particles dispersed in at least some region of the resin part. Each of the plurality of particles dispersed in the coating layer is formed of a material selected from the group consisting of synthetic zeolite, aluminum oxide, calcium chloride, calcium oxide, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride.

When a particle size parameter is plotted on a horizontal axis and scattering efficiency is plotted on a vertical axis, an average particle size D50 of the plurality of particles according to the present aspect is set in a range equal to or greater than a value of the particle size parameter at which the scattering efficiency becomes maximum.

A layer thickness of the coating layer according to the present aspect is not less than 10 μm and not more than 20 μm. The plurality of particles in the resin part is dispersed at a density at which the particles do not overlap one another when the second panel is viewed in plan view.

In the organic light-emitting device according to the above aspect, the layer thickness of the coating layer and a dispersion density of the plurality of particles are defined as described above. Accordingly, incident external light applied to the particles undergoes single scattering, and the scattered light is blocked from outward emission by the circular polarizing film of the second panel. That is, in the coating layer according to the present aspect, the external light incident on the particles does not cause multiple scattering, and outward emission is blocked out by the circular polarizing film of the second panel. This inhibits occurrence of a cloudy phenomenon.

Therefore, the organic light-emitting device according to the present aspect is capable of achieving securing of high visibility and inhibition of decline in contrast in a dark place, in a device structure where emitted light passes through the coating layer and is extracted outward, by inhibiting occurrence of a cloudy phenomenon even when external light enters, while inhibiting functional degradation of the organic layer under influence of substances such as water and oxygen that enter from outside, and outgas.

The organic light-emitting device according to the present aspect may employ various aspects, for example, may employ the following aspects.

In the organic light-emitting device according to another aspect, in the above aspect, the plurality of particles in the coating layer may be dispersed in the at least some region at a density at which a total surface area per 1 $cm^2$ is 0.2 $cm^2$ or less. Defining a dispersion amount of the plurality of particles in the coating layer in this way makes it possible to inhibit occurrence of multiple scattering when external light is applied. Therefore, this is further effective in inhibiting occurrence of a cloudy phenomenon (haze).

It is unnecessary to set a lower limit for the dispersion amount of the plurality of particles from a relationship with scattering of light, but the lower limit may be set at 0.10 wt %. This is because a problem of multiple scattering is unlikely to occur when the dispersion amount of the plurality of particles is less than 0.10 wt %, and because a cloudy phenomenon (haze) is unlikely to occur even without defining the layer thickness of the coating layer as described above. However, it is preferable to increase the dispersion amount of the plurality of particles as much as possible from a viewpoint of inhibiting functional degradation of the organic layer under influence of substances, such as water and oxygen entering from outside, and outgas.

In the organic light-emitting device according to another aspect, the circular polarizing film in the coating layer may be disposed to cover a main surface on a first panel side of the second substrate, and a first main surface contacts the second substrate whereas a second main surface contacts the coating layer. That is, the second panel does not include a color filter layer, which makes it possible to improve efficiency of light extraction. Improvement in color purity may be achieved by cavity adjustment in each luminous part.

In the organic light-emitting device according to another aspect, in the above aspect, the average particle size D50 of the plurality of particles may satisfy a relationship of $0.4\ \mu m \leq D50 \leq 10\ \mu m$. Dispersing the particles that satisfy such a relationship makes it possible to inhibit scattering of light resulting from dispersion of the plurality of particles in the coating layer while maintaining adsorption performances of water, outgas, and the like.

In the organic light-emitting device according to another aspect, in the above aspect, the average particle size D50 of the plurality of particles may satisfy a relationship of $3\ \mu m \leq D50 \leq 10\ \mu m$. It is further preferable to disperse the plurality of particles that satisfy such a relationship in inhibiting scattering of light resulting from dispersion of the plurality of particles in the coating layer while maintaining adsorption performances of water, outgas, and the like.

In the organic light-emitting device according to another aspect, in the above aspect, a refractive-index ratio of the plurality of particles to the resin part may be 1.3 or more, and the average particle size D50 of the plurality of particles may be 0.5 $\mu m$ or more. Defining the refractive-index ratio of the particles to the resin part and the average particle size D50 of the plurality of particles in this way also makes it possible to inhibit occurrence of a cloudy phenomenon (haze) even when external light enters, while inhibiting functional degradation of the organic layer under influence of substances such as water and oxygen entering from outside, and outgas. Therefore, the organic light-emitting device according to the present aspect is capable of achieving securing of high visibility and inhibition of decline in contrast in a dark place.

An organic display apparatus according to one aspect of the present disclosure includes a display panel and a control-drive circuit. The control-drive circuit is a circuit connected to the display panel. A device structure of any one of the above aspects is employed as the display panel. This makes it possible to obtain effects achieved by the organic light-emitting device of the above aspects.

First Exemplary Embodiment

1. Schematic Configuration of Organic EL Display Apparatus 1

A schematic configuration of organic EL display apparatus 1 according to a first exemplary embodiment of the present disclosure will be described with reference to FIG. 3 and FIG. 4.

Figure 3:
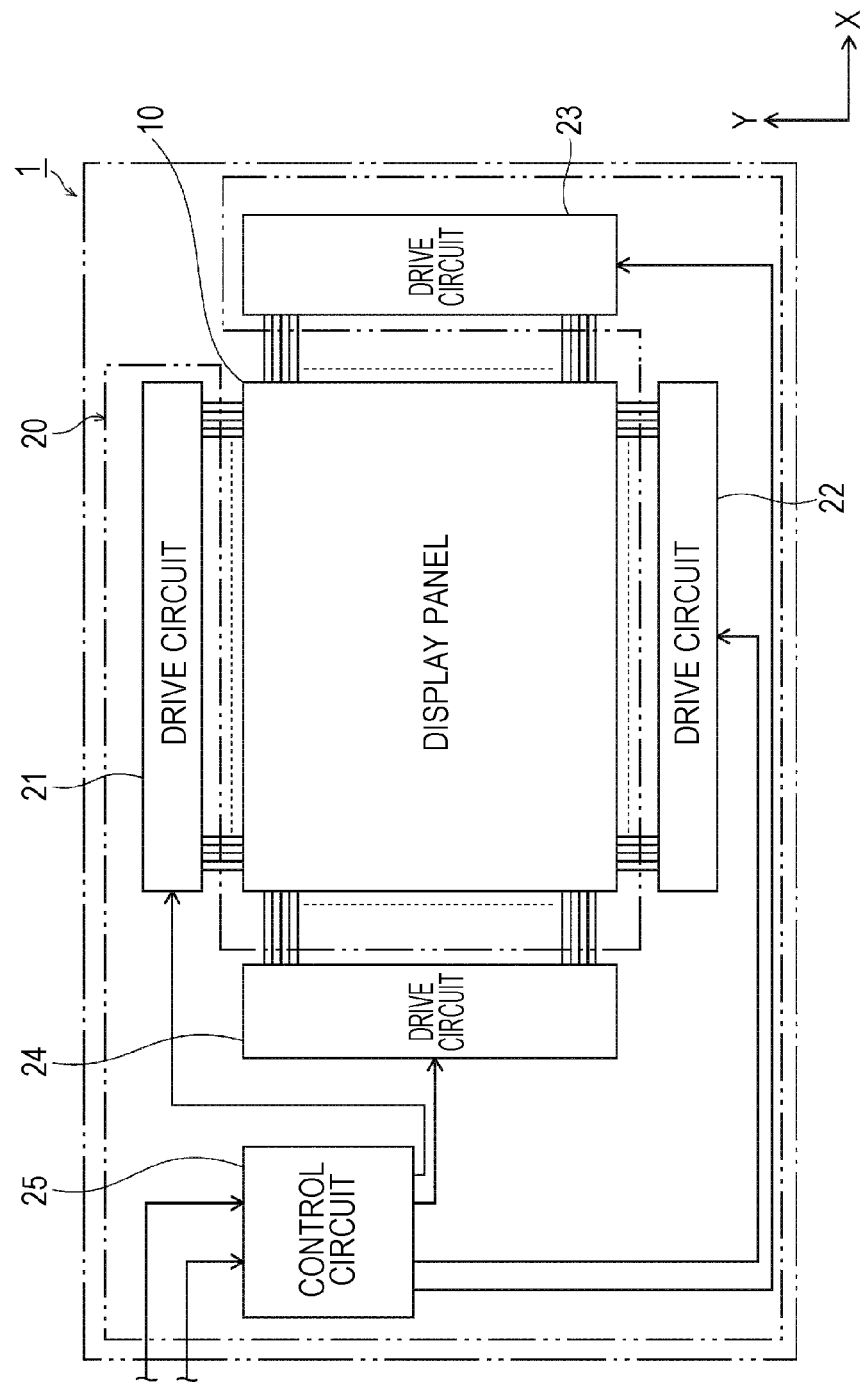
FIG. 3 is a schematic block diagram illustrating a schematic configuration of organic EL display apparatus 1 according to a first exemplary embodiment of the present disclosure.

As illustrated in FIG. 3, organic EL display apparatus 1 includes display panel 10 and drive-control circuit part 20 connected to display panel 10. Display panel 10 is an organic EL panel using electroluminescence of an organic material, and includes a plurality of pixels (picture elements).

Figure 4:
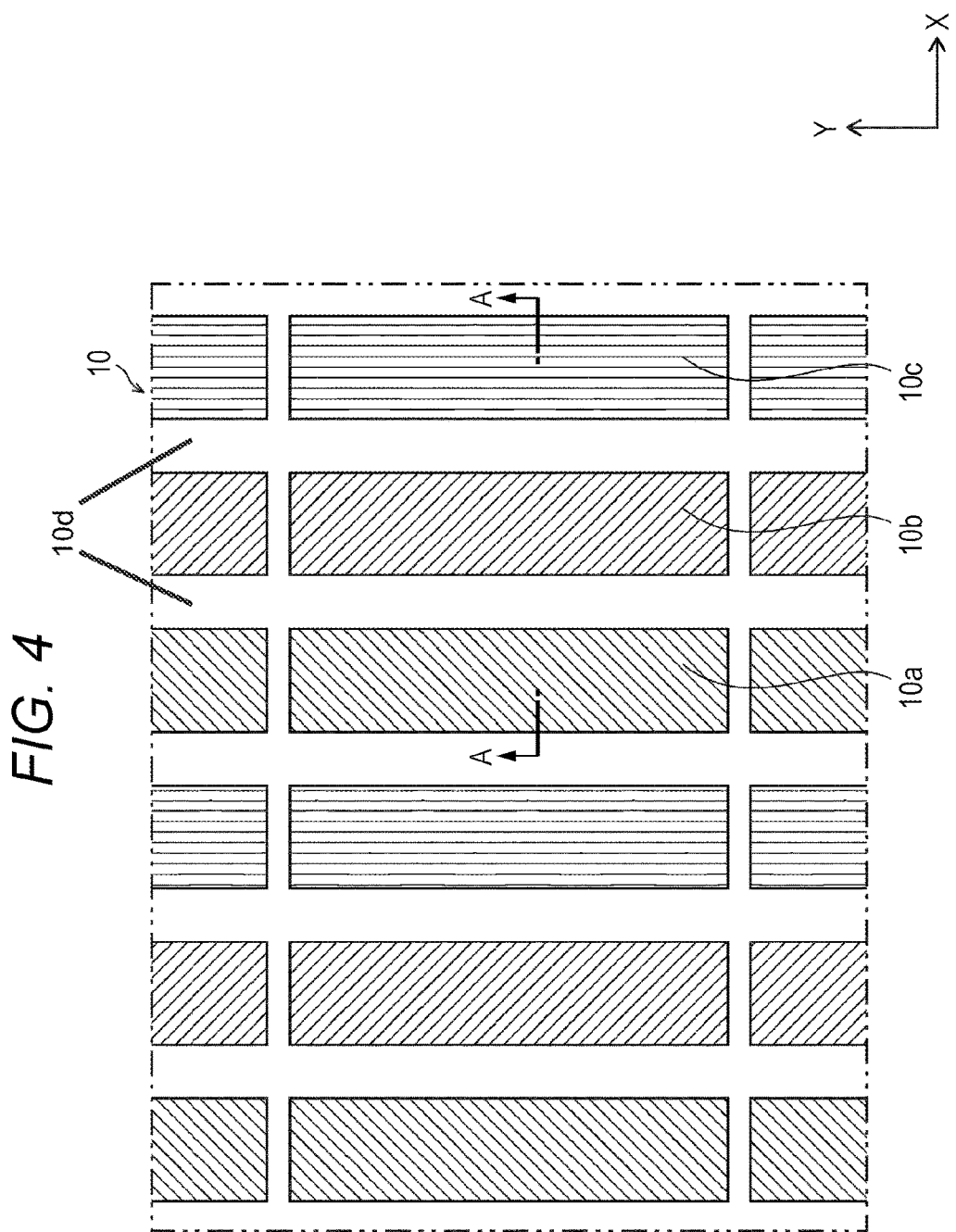
FIG. 4 is a schematic plan view illustrating an arrangement form of subpixels 10a to 10c in display panel 10.

As illustrated in FIG. 4, each of the pixels includes subpixel 10*a* that is a luminous part of red (R), subpixel 10*b* that is a luminous part of green (G), and subpixel 10*c* that is a luminous part of blue (B). In the present exemplary embodiment, the plurality of subpixels 10*a* to 10*c* are arranged in X-axis and Y-axis directions in a matrix (two-dimensional arrangement). Nonluminous region 10*d* is arranged between adjacent subpixels 10*a* to 10*c*.

Returning to FIG. 3, drive-control circuit part 20 includes four drive circuits 21 to 24 and control circuit 25.

A positional relationship between display panel 10 and drive-control circuit part 20 in organic EL display apparatus 1 is not limited to a form of FIG. 3.

The configuration of the pixels in display panel 10 is not limited to a form of three-color subpixels of R, G, B (luminous parts) as illustrated in FIG. 4. The luminous parts of four or more colors may form one pixel.

2. Structure of Display Panel 10

Figure 5:
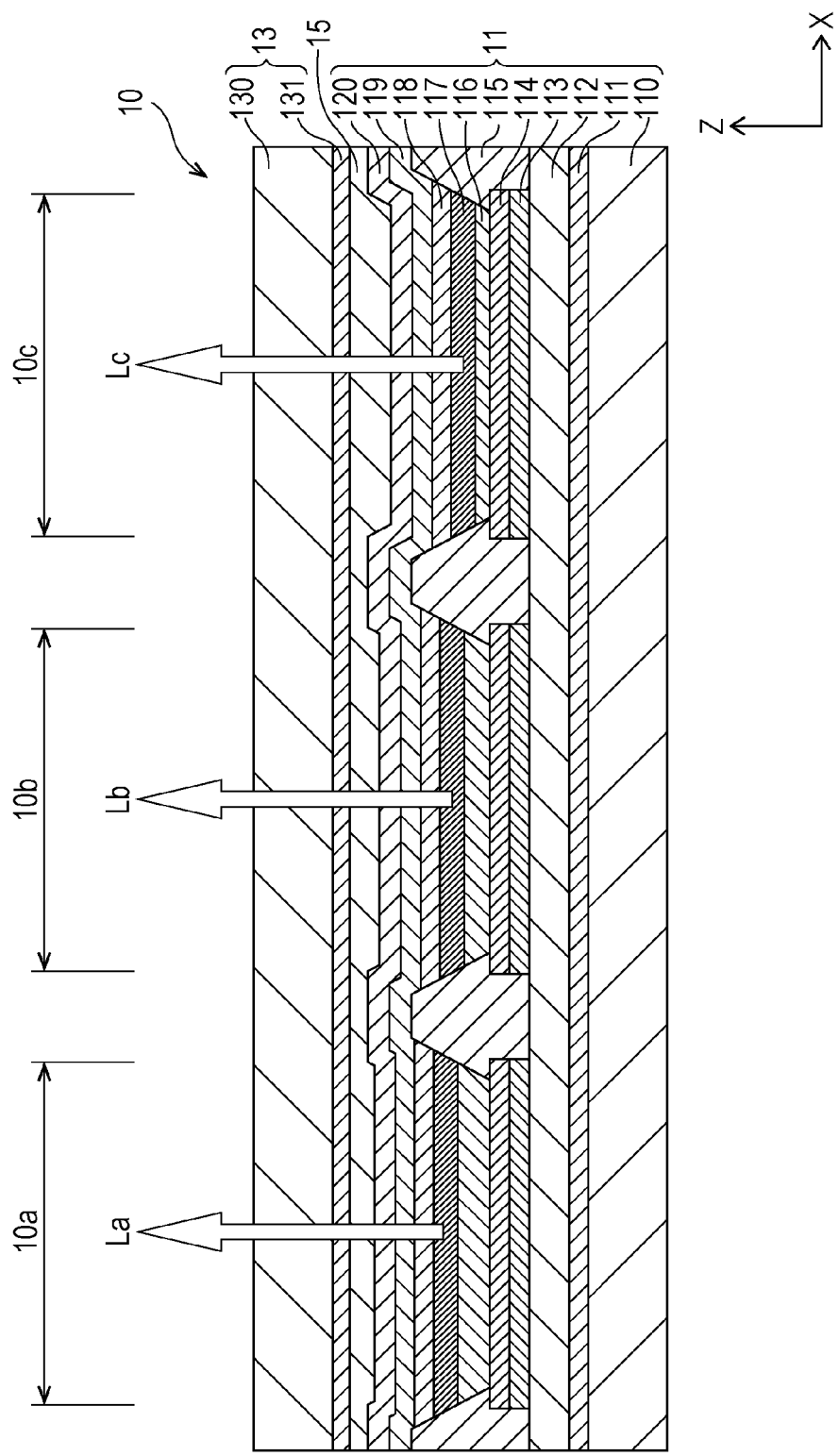
FIG. 5 is a schematic sectional view illustrating a structure taken along line A-A of FIG. 4.

As illustrated in FIG. 5, in display panel 10, EL panel part 11 and CP (circular polarizing) panel part 13 are disposed face-to-face and are joined to each other by resin layer 15 disposed between EL panel part 11 and CP panel part 13.

In EL panel part 11, TFT layer 111 is formed on substrate 110, and insulating layer 112 is laminated on TFT layer 111. A Z-axis upper surface of insulating layer 112 is formed to be generally flat.

Anode 113 and hole injection layer 114 defined for each subpixel 10*a* to 10*c* are sequentially laminated on the Z-axis upper surface of insulating layer 112.

Next, bank 115 is formed to cover both edges of insulating layer 112 and both edges of hole injection layer 114 in the X-axis direction. Bank 115 defines an opening of each luminous region in subpixel 10*a* to 10*c*.

In each opening defined by bank 115, hole transport layer 116, organic luminous layer 117, and electron transport layer 118 are laminated in this order from a bottom of the Z-axis direction.

Cathode 119 and sealing layer 120 are sequentially formed so as to cover a top surface of electron transport layer 118 and bank 115.

CP panel part 13 has a structure in which circular polarizing film 131 is joined on a Z-axis lower surface of substrate 130.

Figure 6:
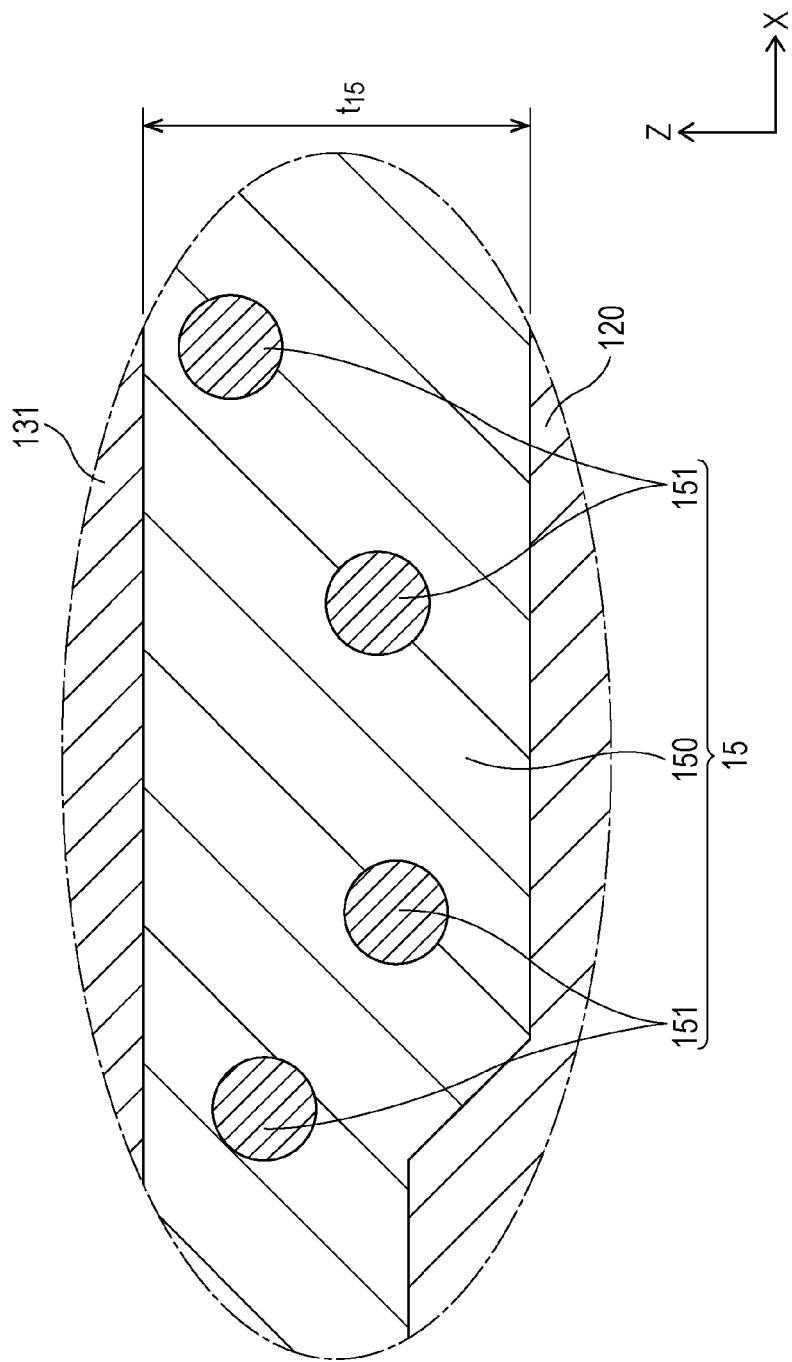
FIG. 6 is a schematic sectional view illustrating a structure of resin layer 15.

As shown in FIG. 6, a Z-axis lower surface of resin layer 15 closely contacts sealing layer 120 of EL panel part 11, and a Z-axis upper surface of resin layer 15 closely contacts circular polarizing film 131 of CP panel part 13. Resin layer 15 includes a plurality of getter particles 151 dispersed in resin part 150. In subpixels 10a to 10b that are luminous regions, getter particles 151 are dispersed in entire resin part 150.

Returning to FIG. 5, display panel 10 according to the present exemplary embodiment is a top-emission display panel, and emits Z-axis upward light La to Lc as illustrated by arrows. In display panel 10 according to the present exemplary embodiment, although a color filter layer is not formed in substrate 130, cavity design in each subpixel 10a to 10b enhances color purity.

3. Each Component of Display Panel 10

(1) Substrate 110

Substrate 110 is formed, for example, from substrates such as a glass substrate, a quartz substrate, a silicon substrate, a metal substrate such as molybdenum sulfide, copper, zinc, aluminum, stainless steel, magnesium, iron, nickel, gold, and silver, a semiconductor substrate such as a gallium arsenide group, and a plastic substrate.

As the plastic substrate, one of a thermoplastic resin and a thermosetting resin may be used. Examples of the resin include polyolefin such as polyethylene, polypropylene, ethylene-propylene copolymer, and ethylene-vinyl acetate copolymer (EVA), cyclic polyolefin, modified polyolefin, polyvinyl chloride, polyvinylidene chloride, polystyrene, polyamide, polyimide (PI), polyamide-imide, polycarbonate, poly-(4-methylpentene-1), ionomer, an acrylic resin, polymethyl methacrylate, acrylonitrile-styrene copolymer (an AS resin), butadiene-styrene copolymer, ethylene-vinyl alcohol copolymer (EVOH), polyester such as polyethylene terephthalate (PET), polybutylene terephthalate, polyethylene naphthalate (PEN), and polycyclohexylene dimethylene terephthalate (PCT), polyether, polyether ketone, polyether sulfone (PES), polyether imide, polyacetal, polyphenylene oxide, modified polyphenylene oxide, polyarylate, aromatic polyester (liquid crystal polymer), polytetrafluoroethylene, polyvinylidene fluoride, other fluororesins, various thermoplastic elastomers, such as styrene, polyolefin, polyvinyl chloride, polyurethane, fluororubber, and chlorinated polyethylene, an epoxy resin, a phenol resin, a urea resin, a melamine resin, unsaturated polyester, a silicone resin, polyurethane, or copolymers that mainly contain these resins, blends, and a polymer alloy. A laminate including one or two types of these materials can be used.

(2) TFT Layer 111

(i) Gate Electrode

Examples of materials that form a gate electrode include copper (Cu). For example, a laminate of a layer made of copper (Cu) and a layer made of molybdenum (Mo) may be employed.

However, the structure of the gate electrode is not limited to these materials, and for example, materials such as a monolayer of Cu and a laminate of Cu—W may also be employed, and it is also possible to employ the following materials.

Materials that may be employed in addition to the above materials include metals such as chromium (Cr), aluminum (Al), tantalum (Ta), niobium (Nb), silver (Ag), gold (Au), platinum (Pt), palladium (Pd), indium (In), nickel (Ni), and neodymium (Nd), and alloys thereof; conductive metal oxides such as zinc oxide, tin oxide, indium oxide, and gallium oxide; conductive metal compound oxides such as indium tin oxide (ITO), indium zinc oxide (IZO), aluminum zinc oxide (AZO), and gallium zinc oxide (GZO); conductive polymers such as poly aniline, poly pyrrole, polythiophene, and polyacetylene; conductive polymers doped with acids such as hydrochloric acid, sulfuric acid, and sulfonic acid, Lewis acid such as phosphorus hexafluoride, arsenic pentafluoride, and iron chloride, halogen atoms such as iodine, metal atoms such as sodium and potassium; conductive composite materials in which carbon black or metal particles are dispersed. Alternatively, polymer mixtures that contain metal microparticles and conductive particles such as graphite may be used. These materials may be used alone or in combination.

(ii) Gate Insulating Layer

A gate insulating layer may be formed from, for example, a laminate of silicon oxide (SiO) and silicon nitride (SiN). However, the structure of the gate insulating layer is not limited to these materials. The gate insulating layer may be formed from, for example, any one of known organic materials and inorganic materials, as long as the material has electric insulating properties.

As the organic materials, for example, the gate insulating layer may be formed from acrylic resins, phenol resins, fluorine resins, epoxy resins, imide resins, and novolac resins.

Examples of the inorganic materials include; metal oxides such as silicon oxide, aluminum oxide, tantalum oxide, zirconium oxide, cerium oxide, zinc oxide, and cobalt oxide; metal nitrides such as silicon nitride, aluminum nitride, zirconium nitride, cerium nitride, zinc nitride, cobalt nitride, titanium nitride, and tantalum nitride; metal compound oxides such as barium strontium titanate and lead zirconium titanate. These materials may be used alone or in combination.

Furthermore, the gate insulating layer may have a surface thereof processed by using a surface treatment agent (ODTS, OTS, HMDS, βPTS) or the like.

(iii) Channel Layer

A channel layer may be formed through employment of a layer made of amorphous indium gallium zinc oxide (IGZO). Materials for forming the channel layer is are not limited to this material, and oxide semiconductors including at least one selected from the group consisting of indium (In), gallium (Ga), and zinc (Zn) may be employed.

A layer thickness of the channel layer may be, for example, within a range from 20 nm to 200 nm. The layer thickness does not need to be identical in all the channel layers formed in display panel 10, and some layer thickness may be set to be different.

(iv) Channel Protective Layer

A channel protective layer may be formed through employment of a layer made of silicon oxide (SiO). However, materials for forming the channel protective layer are not limited to this material, and for example, silicon oxynitride (SiON), silicon nitride (SiN), or aluminum oxide (AlOx) may be used. The channel protective layer may also be formed by laminating a plurality of layers made of the above materials.

A layer thickness of the channel protective layer may be, for example, within a range from 50 nm to 500 nm.

(v) Source Electrode and Drain Electrode

A source electrode and a drain electrode may be formed through employment of a laminate of copper manganese (CuMn) and molybdenum (Mo).

(vi) Interlayer Insulating Layer

An interlayer insulating layer may be formed through employment of a layer made of silicon oxide (SiO).

(vii) Upper Electrode

An upper electrode may be formed, in a similar manner to the source electrode and the drain electrode, through employment of a laminate of copper manganese (CuMn) and molybdenum (Mo).

(viii) Passivation Layer

A passivation layer may be formed through employment of a layer made of silicon nitride (SiN).

In a case where the channel layer made of an oxide semiconductor is employed, in order to inhibit reduction of the oxide semiconductor, it is also possible to employ the passivation layer formed by lamination of silicon oxide (SiO) and silicon nitride (SiN) from the channel layer side.

(3) Insulating Layer 112

Insulating layer 112 is formed from, for example, organic compounds, such as polyimide, polyamide, and acrylic resin materials. Insulating layer 112 preferably has resistance to organic solvents.

Insulating layer 112, which sometimes undergoes treatment including etching treatment and baking treatment in the manufacturing process, is preferably formed from materials that have high resistance to the treatments to avoid excessive deformation and deterioration.

(4) Anode 113

Anode 113 is formed of metallic materials including silver (Ag) or aluminum (Al). A surface of top-emission display panel 10 according to the present exemplary embodiment preferably has high reflectivity.

Anode 113 can employ not only the above-described monolayer structure made of metallic materials but also a lamination of metallic layers and transparent conductive layers. As a component of the transparent conductive layer, for example, materials such as indium tin oxide (ITO) and indium zinc oxide (IZO) can be used.

(5) Hole Injection Layer 114

Hole injection layer 114 is a layer made of, for example, an oxide of silver (Ag), molybdenum (Mo), chromium (Cr), vanadium (V), tungsten (W), nickel (Ni), iridium (Ir), or a conductive polymer material such as PEDOT (mixture of polythiophene and polystyrene sulfonate).

Using a metallic oxide as a component for hole injection layer 114 allows hole injection layer 114 to have a function to inject holes into organic luminous layer 117 stably or by assisting hole generation, and to have a large work function, as compared with a case where a conductive polymer material is used, such as PEDOT.

Hole injection layer 114 formed of a transition metal oxide can have a plurality of oxidization numbers, and accordingly a plurality of levels. This results in easy hole injection and reduction in a drive voltage. In particular, it is preferable to use tungstic oxide (WOx) from a viewpoint of having functions to inject holes stably and to assist generation of holes.

(6) Bank 115

Bank 115 is formed from organic materials such as a resin, and has insulating properties. Examples of organic materials used for formation of bank 115 include an acrylic resin, a polyimide resin, and a novolac phenol resin. Bank 115 can also undergo fluorine treatment to a surface thereof in order to give water-repellency to the surface.

Furthermore, the structure of bank 115 can employ not only the one-layer structure illustrated in FIG. 5 but also a multilayer structure including two or more layers. In this case, the above-described materials can be combined for each layer, and inorganic materials and organic materials can be used for each layer.

(7) Hole Transport Layer 116

Hole transport layer 116 is formed from a macromolecular compound that does not contain a hydrophilic group. For example, a macromolecular compound that does not contain a hydrophilic group, such as polyfluorene and a derivative thereof, and polyarylamine and a derivative thereof may be used.

(8) Organic Luminous Layer 117

Organic luminous layer 117 has a function to generate an excited state and to emit light through injection and recombination of holes and electrons. In order to form organic luminous layer 117, it is necessary to use a luminous organic material from which a film can be formed by a wet printing method.

Specifically, it is preferable that organic luminous layer 117 be formed of, for example, fluorescent substances described in U.S. Pat. No. 5,443,922, which is incorporated herein by reference, such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, metal complex of a Schiff base and group III metal, oxine metal complex, and rare earth complex.

(9) Electron Transport Layer 118

Electron transport layer 118 has a function to transport electrons injected from cathode 119 to organic luminous layer 117, and is formed from, for example, an oxadiazole derivative (OXD), a triazole derivative (TAZ), and a phenanthroline derivative (BCP, Bphen).

(10) Cathode 119

Cathode 119 is formed from, for example, indium tin oxide (ITO) or indium zinc oxide (IZO). As in the present exemplary embodiment, for top-emission display panel 10 according to the present exemplary embodiment, cathode 119 needs to be formed of a light-transparent material. Regarding the light-transparency, transmittance is preferably equal to or higher than 80%.

(11) Sealing Layer 120

Sealing layer 120 has a function to inhibit organic layers, such as organic luminous layer 117, from being exposed to water or air. Sealing layer 120 is formed from, for example, materials, such as silicon nitride (SiN) and silicon oxynitride (SiON). A sealing resin layer made of resin materials, such as an acrylic resin and a silicone resin, may be provided on a layer formed of materials such as silicon nitride (SiN) and silicon oxynitride (SiON).

In top-emission display panel 10 according to the present exemplary embodiment, sealing layer 120 needs to be formed of a light-transparent material.

(12) CP Panel Part 13

Substrate 130 of CP panel part 13 is formed in a similar manner as described above, for example, from a glass substrate, a quartz substrate, a silicon substrate, a metal substrate such as molybdenum sulfide, copper, zinc, aluminum, stainless steel, magnesium, iron, nickel, gold, and silver, a semiconductor substrate such as a gallium arsenide group, and a plastic substrate. When the plastic substrate is employed also in substrate 130 of CP panel part 13, one of a thermoplastic resin and a thermosetting resin may be used.

In CP panel part 13, circular polarizing film 131 is joined so as to cover the main surface on the Z-axis lower surface of substrate 130.

(13) Resin Layer 15

Resin layer 15 is formed of a transparent resin material as a base material. A detailed structure of resin layer 15 will be described below.

4. Structure of Resin Layer 15

As illustrated in FIG. 6, resin layer 15 includes resin part 150 and the plurality of getter particles 151 dispersed in resin part 150. In the present exemplary embodiment, getter particles 151 are dispersed in an entire region of resin layer 15.

Resin part 150 is formed of a transparent resin material, as described above. For example, resin part 150 is formed of an epoxy resin material. However, a material such as a silicone resin can also be used besides an epoxy resin material as a component of resin part 150.

Getter particles 151 are formed of a material selected from the group consisting of synthetic zeolite, aluminum oxide, calcium chloride, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride. In the present exemplary embodiment, getter particles 151 are formed of synthetic zeolite (crystalline zeolite: $M_{2/n}Al_2O_3 \cdot xSiO_2$—$H_2O$, M; metal cation, n; valence) as an example. More specifically, 5A Molecular Sieve (a product name of Linde North America Inc.) is employed.

As illustrated in FIG. 6, in display panel 10 according to the present exemplary embodiment, layer thickness t15 of resin layer 15 is set in a range from 10 μm to 20 μm inclusively (for example, 15 μm).

Figure 7:
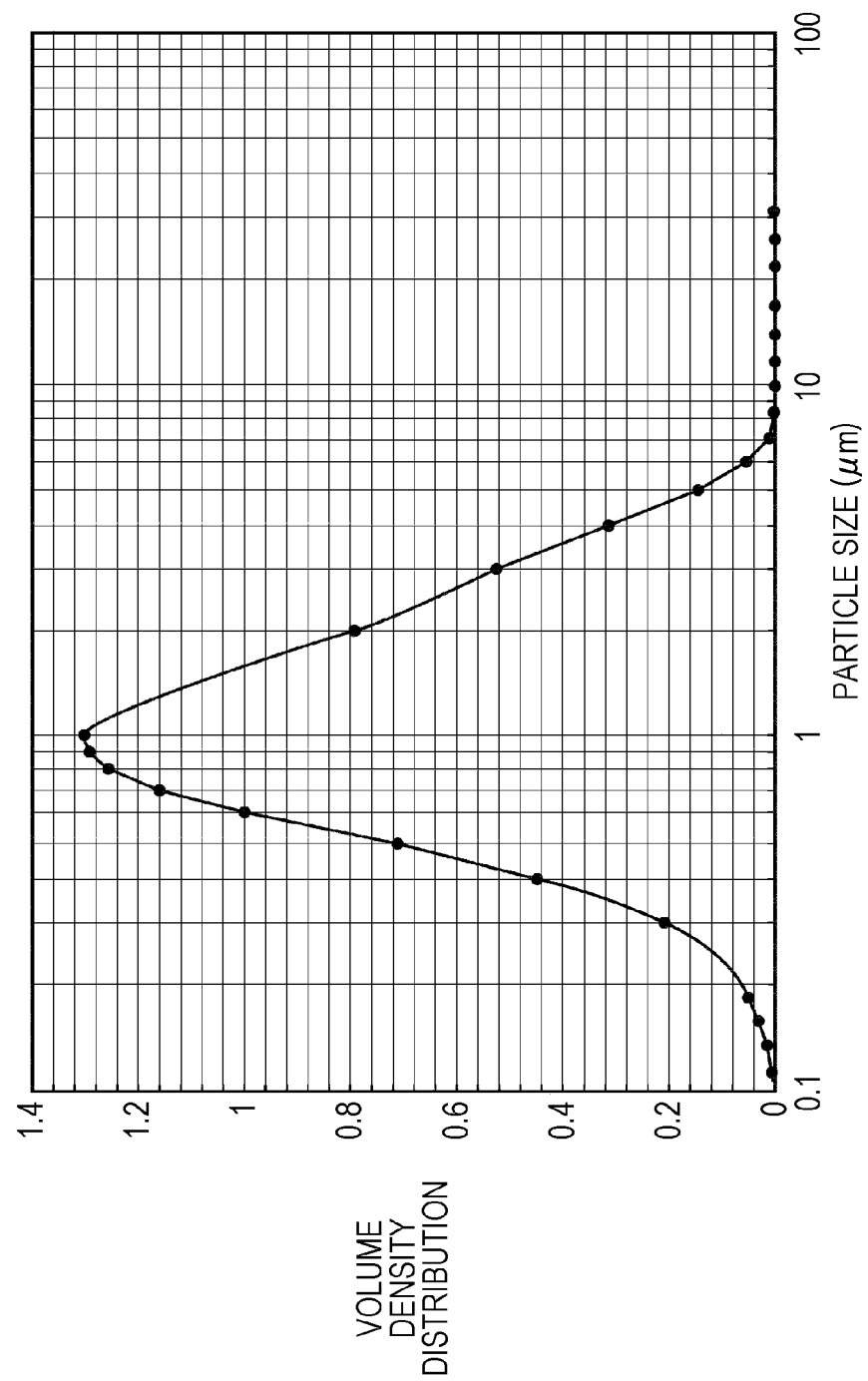
FIG. 7 is a graph illustrating particle size distribution of getter particles 151 dispersed in resin layer 15.

Next, particle size distribution of getter particles 151 is illustrated in FIG. 7. However, the average particle size $D50_{(151)}$ of getter particles 151 only needs to satisfy the following relationship.

$$0.4 \text{ μm} \leq D50_{(151)} \leq 10 \text{ μm} \quad \text{[Expression 1]}$$

A dynamic light scattering method (laser light scattering method) is employed as a method for measuring the particle size (diameter of particles). In measurement of the particle size by another method, it is possible to perform conversion with the dynamic light scattering method employed in the present aspect.

More preferably, the average particle size $D50_{(151)}$ of getter particles 151 satisfies the following relationship.

$$3 \text{ μm} \leq D50_{(151)} \quad \text{[Expression 2]}$$

When the refractive-index ratio to resin part 150 is 1.3 or more, the average particle size $D50_{(151)}$ of getter particles 151 may satisfy the following relationship.

$$0.5 \text{ μm} \leq D50_{(151)} \quad \text{[Expression 3]}$$

5. Functions of Getter Particles 151 Performed in Resin Layer 15

Functions of particles 151 performed in resin layer 15 will be described with reference to the drawings from FIG. 8A to FIG. 12.

(a) Getter Characteristic

Figure 8A:
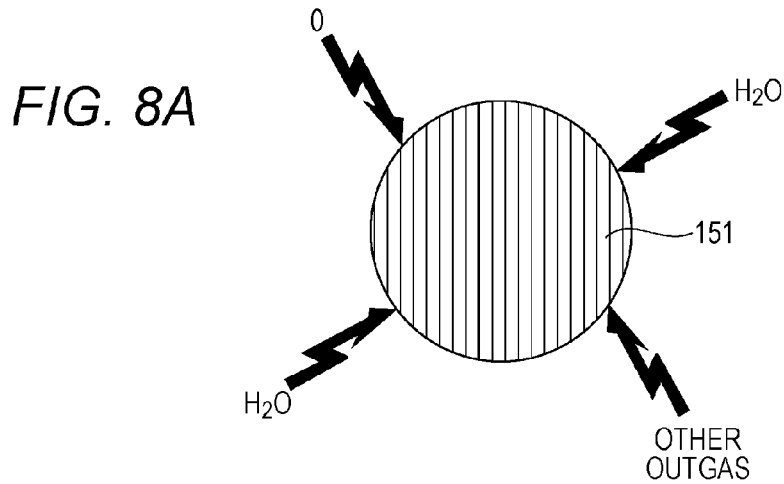
FIG. 8A is a schematic diagram illustrating how substances such as water are adsorbed by getter particle 151.

In the present exemplary embodiment, particles made of synthetic zeolite are employed as described above, as getter particles 151 in resin layer 15. Accordingly, as illustrated in FIG. 8A, each of getter particles 151 adsorbs components including oxygen ($O_2$) and water ($H_2O$) in resin layer 15. Getter particle 151 adsorbs substances such as water and oxygen (outgas) included in resin part 150 and other parts, in addition to components, such as water, that enters from outside of display panel 10.

The present inventor has measured water content of resin materials used for formation of resin layer in the organic EL display that is an example of an organic light-emitting device. A result of the measurement shows that the water content generally ranges from 10 ppm to 200 ppm, depending on types of the resin materials to employ.

In addition, it is considered that water from resin layer significantly affects degradation in a light emission characteristic of the organic light-emitting device.

Accordingly, it is considered that, in resin part 150 of resin layer 15, the resin of 1 g contains water of up to some tens of micrograms in the manufacturing process or immediately after manufacture.

Here, a relationship between an adsorption diameter in synthetic zeolite (molecular sieve) and components to be adsorbed is as illustrated in the following table.

TABLE 1

| Type (adsorption diameter) | Components to be adsorbed |
| --- | --- |
| 3A (3 Å = 0.3 nm) | $H_2O$, $NH_3$, He |
| 4A (4 Å = 0.4 nm) | $H_2O$, $NH_3$, $H_2S$, $CO_2$, $C_2H_5$, $C_3H_6$, $CH_3OH$, $C_2H_5OH$, $C_4H_6$ |
| 5A (5 Å = 0.5 nm) | $H_2O$, $NH_3$, $H_2S$, $CO_2$, n-paraffin, n-olefin, n-$C_4H_9OH$ |
| 13X (10 Å = 1.0 nm) | iso-paraffin, iso-olefin, di-n-butylamine aromatic compound |

The present exemplary embodiment employs 5A synthetic zeolite (molecular sieve) in consideration of conditions such as types of outgas and possible components entering from outside.

As described above, from a viewpoint of securing the getter characteristic, the concentration of getter particles 151 in resin layer 15 is preferably equal to or greater than 0.001 wt %. However, it is more preferable that the concentration be equal to or greater than 0.01 wt % depending on the resin material to be used.

When the concentration of getter particles 151 in resin layer 15 is less than 0.10 wt %, occurrence of a cloudy phenomenon (haze) caused by incident external light is unlikely to pose a problem. However, from a viewpoint of securing of adsorption performances of substances such as water, it is necessary to disperse getter particles 151 of an amount that can sufficiently adsorb the estimated amount of water described above.

Furthermore, in order to inhibit the panel from being observed as cloudy arising from scattering of external light, a total surface area of getter particles 151 per 1 $cm^2$ of resin layer 15 is adjusted to 0.2 $cm^2$ or less. Such definition of the amount of dispersed getter particles 151 and layer thickness t15 of resin layer 15 described above allows external light to undergo single scattering by getter particles 151, and allows inhibition of scattering light from being emitted outward by circular polarizing film 131. This makes it possible to secure the light transmittance of 98% in resin layer 15, and thus the problem of cloudiness is unlikely to occur.

(b) Light Scattering Characteristic

Figure 8B:
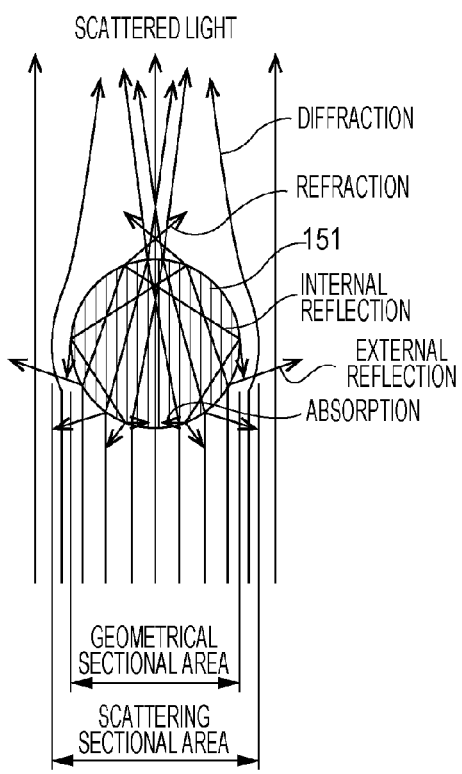
FIG. 8B is a schematic diagram illustrating a state of refraction of light, etc. when a refractive index of getter particle 151 is larger than a refractive index of resin part 150.

When the refractive index $n_{(151)}$ of getter particle 151 is larger than the refractive index $n_{(150)}$ of resin part 150, the scattering characteristic of light is exhibited as illustrated in FIG. 8B. That is, as illustrated in FIG. 8B, light incident in getter particle 151 is refracted, diffracted, or absorbed, but most of the light is scattered upward. Accordingly, only very small portion of the light is scattered obliquely.

Figure 8C:
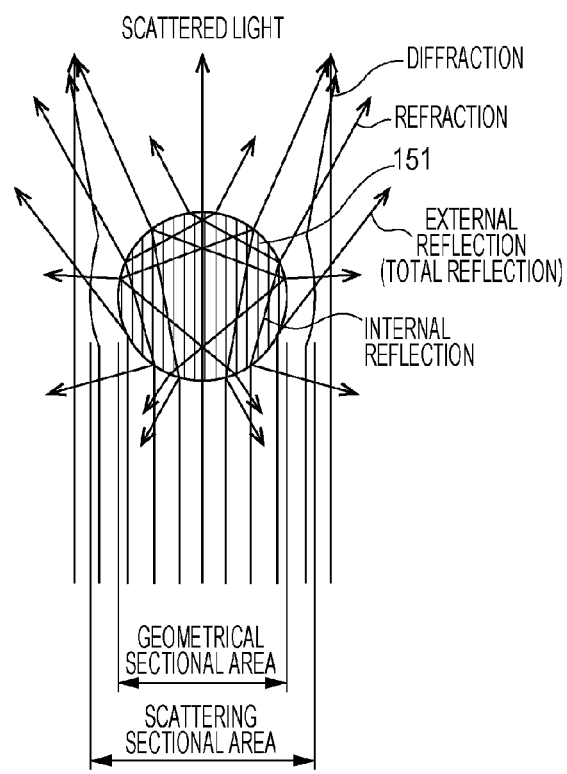
FIG. 8C is a schematic diagram illustrating a state of refraction of light, etc. when the refractive index of getter particle 151 is smaller than the refractive index of resin part 150.

On the other hand, FIG. 8C illustrates the scattering characteristic of light when the refractive index $n_{(151)}$ of getter particle 151 is smaller than the refractive index $n_{(150)}$ of resin part 150. As illustrated in FIG. 8C, when the refractive index $n_{(151)}$ of getter particle 151 is smaller than the refractive index $n_{(150)}$ of resin part 150, more light is scattered obliquely by external reflection (total reflection) as compared with the case illustrated in FIG. 8B.

Here, a scattering sectional area and a geometrical sectional area are defined as illustrated in FIG. 8B and FIG. 8C. As illustrated in FIG. 7, the average particle size $D50_{(151)}$ of the plurality of getter particles 151 contained in resin layer 15 is approximately 1.0 μm in the present exemplary embodiment. This particle size is larger than a wavelength of the light emitted from the luminous part. Accordingly, the light applied to getter particles 151 in resin layer 15 will be Mie-scattered.

Cumulative distribution size D10 of the plurality of getter particles 151 to be dispersed may be 100 nm or more, and cumulative distribution size D90 may be 10 μm or less. A method for measuring the particle size is as described above.

6. Particle Size and Concentration of the Getter Particles, and Transmittance

A resin layer is formed containing the getter particles between two transparent glass substrates, and a relationship between the particle size and concentration of the getter particles, and the transmittance are studied. A result of the study will be described with reference to FIG. 9 to FIG. 12. In this study, silica particles are used as the getter particles.

(1) Scattering Angle and Light Intensity of Transmitted Light

A relationship between a scattering angle and light intensity of transmitted light is studied, in a case where the particle size D of the getter particles is 1 μm, the concentration is 1 wt %, a layer thickness of the resin layer is 15 μm, and an incident wavelength is switched among three types. As illustrated in FIG. 9, it is understood that scattered light is concentrated within ±3 degrees, and that most scattered light is scattered forward in Mie-scattering.

(2) Particle Size of the Getter Particles and Transmittance

Figure 10A:
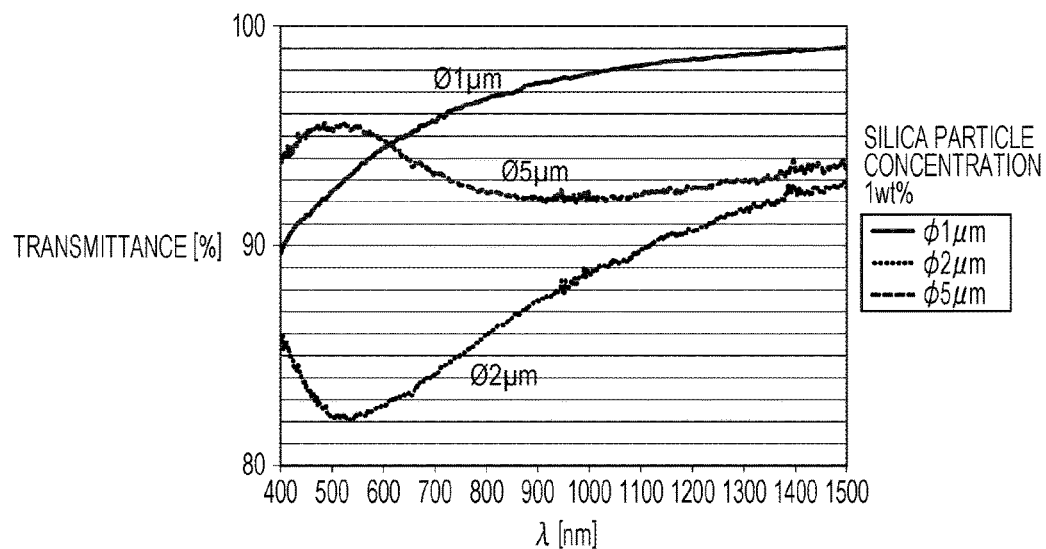
FIG. 10A is a graph illustrating a relationship between a wavelength of light and transmittance for each particle size of getter particles 151.
Figure 10B:
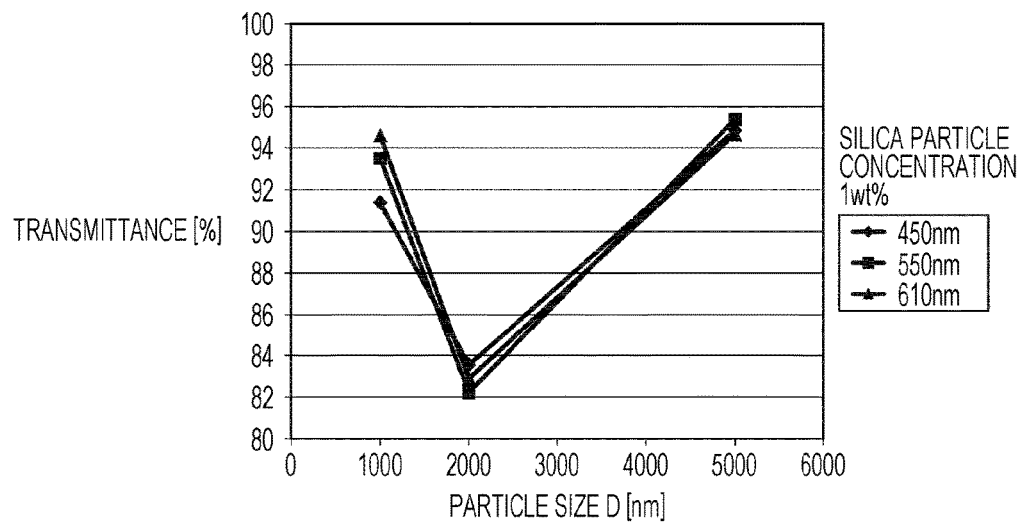
FIG. 10B is a graph illustrating a relationship between the particle size of getter particles 151 and transmittance of light for each wavelength of light.

FIG. 10A illustrates dependence of intensity of transmitted light on the wavelength in a case where the concentration is 1 wt %, the layer thickness of the resin layer is 15 μm, and the particle size D of the getter particles is switched among three types of 1 μm, 2 μm, and 5 μm. FIG. 10B illustrates a relationship between the particle size D and the transmittance in blue light (λ=450 nm), green light (λ=550 nm), and red light (λ=610 nm) of visible light wavelengths.

As illustrated in FIG. 10A and FIG. 10B, in the visible light wavelengths, the transmittance is the lowest when the particle size D is 2 μm, and the transmittance increases at 5 μm. Meanwhile, the transmittance increases also when the particle size D is 1 μm. As illustrated in FIG. 2A and FIG. 2B, this indicates that scattering of light can be reduced in a range where the particle size D exceeds a point of inflection.

This also indicates that a difference in the transmittance with regard to the wavelength is unlikely to occur at the particle size D of 5 μm, while wavelength dependence is strong at the particle size D of 1 μm. It is understood that, when the particle size D is 1 μm, factors of Rayleigh scattering is exhibited.

(3) Concentration and Transmittance

Figure 11:
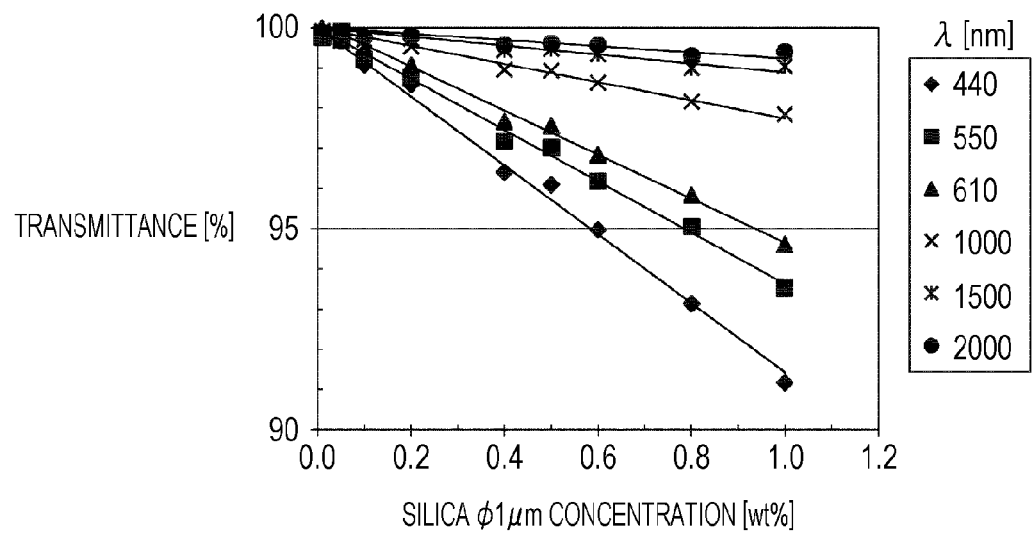
FIG. 11 is a graph illustrating a relationship between concentration of getter particles 151 and transmittance of light for each wavelength of light.

FIG. 11 illustrates intensity of transmitted light in a case where the particle size D is 1 μm, the layer thickness of the resin layer is 15 μm, and the concentration is changed from 0 wt % to 1.0 wt %. As illustrated in FIG. 11, it is understood that the transmittance decreases in proportion to the concentration of the getter particles and that the scattering probability is proportional to the number of getter particles.

In particular, when the concentration is 0.2 wt %, the transmittance of light with a wavelength of 440 nm may be approximately 98%.

(4) Thickness of the Resin Layer and Transmittance

Figure 12:
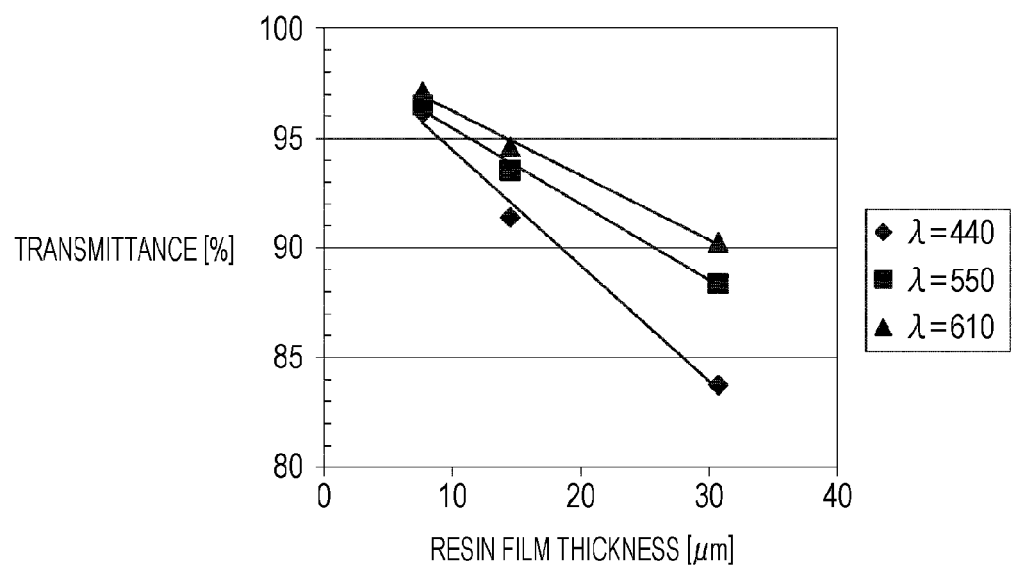
FIG. 12 is a graph illustrating a relationship between a resin film thickness and transmittance of light for each wavelength of light.

FIG. 12 illustrates a relationship between the layer thickness of the resin layer and intensity of the transmitted light when the particle size D is 1 μm. It is understood that the transmittance decreases as the layer thickness of the resin layer increases. This is considered because the number of particles increases in proportion to the layer thickness of the resin layer.

In particular, when the thickness of the resin layer is 30 μm, the transmittance of light with a wavelength of 440 nm decreases to approximately 83%.

On the other hand, when the thickness of the resin layer is 10 μm, the transmittance of 96% to 97% may be secured in an entire wavelength range.

Thus, it is understood that, from a viewpoint of improvement in the transmittance, a larger particle size D of the getter particles is preferable.

7. Dispersion Density of Getter Particles 151 in Resin Layer 15 and External Light Scattering.

Figure 14A:
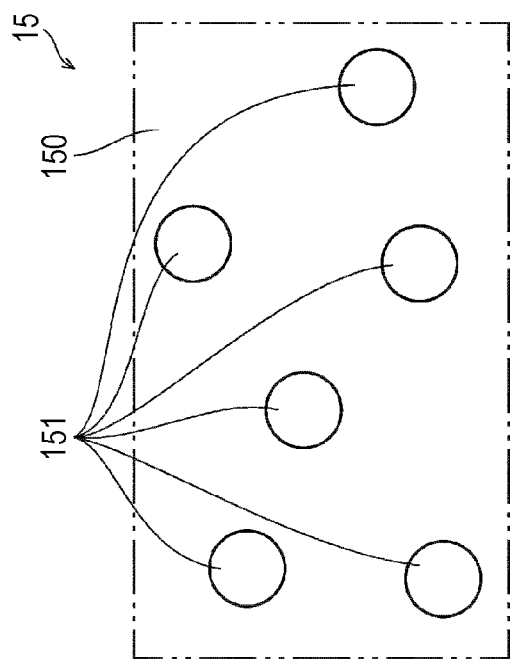
FIG. 14A is a schematic diagram illustrating how getter particles 151 are dispersed in a case where resin layer 15 according to the exemplary embodiment is viewed in plan view.
Figure 14B:
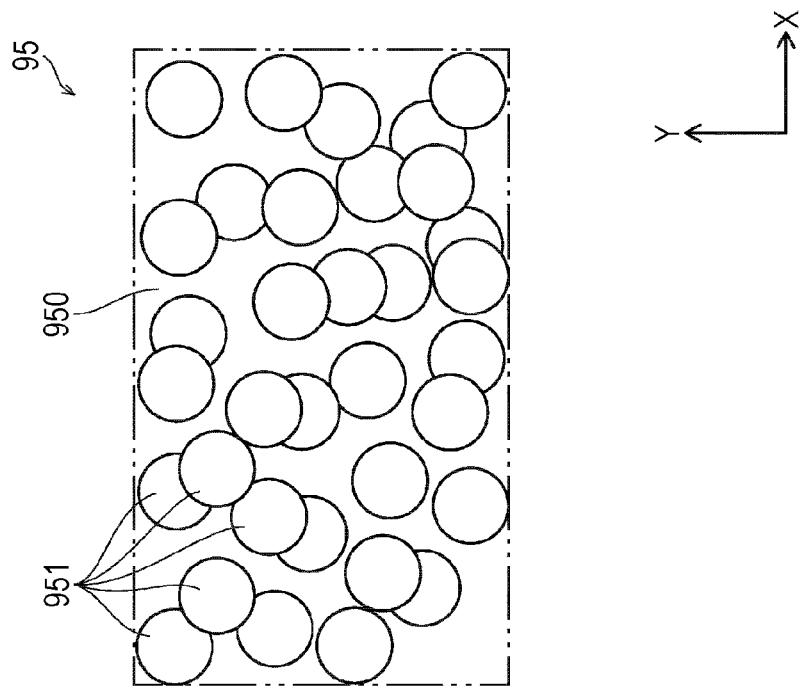
FIG. 14B is a schematic diagram illustrating how getter particles 951 are dispersed in a case where resin layer 95 according to the comparative example is viewed in plan view.

Dispersion density of getter particles 151 and external light scattering in resin layer 15 will be described with reference to FIG. 13A to FIG. 14B. FIG. 13A and FIG. 14A illustrate resin layer 15 according to the exemplary embodiment, whereas FIG. 13B and FIG. 14B illustrate resin layer 95 according to a comparative example.

First, as illustrated in FIG. 13A, in the structure according to the exemplary embodiment, external light $L_0$ incident from a CP panel side passes through circular polarizing film 131, whereby right polarized light $L_1$ enters resin layer 15. Part of light $L_1$ is scattered by getter particles 151 in resin layer 15, and part of the scattered light travels to the CP panel side. The light scattered by getter particles 151 is left polarized light $L_2$. Left polarized light $L_2$ is blocked out by circular polarizing film 131, and is not emitted out of the CP panel. Light reflected by anode 113 is also left polarized light $L_3$, and is similarly blocked out by circular polarizing film 131.

In this way, in resin layer 15 according to the exemplary embodiment, the incident external light undergoes "single scattering" by getter particles 151 dispersed in resin layer 15. This may be achieved by defining the layer thickness of resin layer 15 in a range from not less than 10 μm to not more than 20 μm (15 μm as an example in the present exemplary embodiment) and by defining the density of getter particles 151 in resin layer 15 so that the total surface area per 1 cm$^2$ may be equal to or less than 0.2 cm$^2$.

The density of getter particles 151 in resin layer 15 may be defined so that, as illustrated in FIG. 14A, getter particles 151 may not overlap one another in plan view from a direction perpendicular to the main surface of the CP panel.

On the other hand, as illustrated in FIG. 14B, in resin layer 95 according to the comparative example, getter particles 951 overlap one another in plan view from the direction perpendicular to the main surface of the CP panel.

As illustrated in FIG. 13B, in the structure according to the comparative example, external light $L_0$ incident from the CP panel side passes through circular polarizing film 131 as described above, whereby right polarized light $L_1$ enters resin layer 95. In resin layer 95 according to the comparative example, since getter particles 951 are dispersed at a high density in resin part 950, left polarized light $L_2$ scattered by getter particles 951 travels to circular polarizing film 131 as it is. However, another left polarized light $L_4$ is further scattered by getter particles 951 and travels to circular polarizing film 131 as right polarized light $L_5$. Left polarized light $L_3$ reflected by anode 113 and scattered by getter particles 951 again also travels to circular polarizing film 131 as right polarized light $L_6$.

In a case where the density of getter particles 951 in resin layer 95 is high and the incident external light undergoes "multiple scattering" in this way, right polarized light $L_5$, $L_6$ are not blocked out by circular polarizing film 131, but passes through circular polarizing film 131 and is emitted outward. This results in a cloudy phenomenon (haze) in the structure according to the comparative example.

As described above, the exemplary embodiment that defines that getter particles 151 in resin layer 15 do not overlap one another in plan view is capable of inhibiting occurrence of a cloudy phenomenon (haze) because only single scattering occurs in resin layer 15.

8. Formation of CP Panel Part 13 and Lamination of EL Panel Part 11 and CP Panel Part 13

In a method for manufacturing organic EL display apparatus 1 according to the present exemplary embodiment, a process for forming CP panel part 13 and a process for laminating EL panel part 11 and CP panel part 13 will be described with reference to FIG. 15A to FIG. 15C.

Figure 15A:
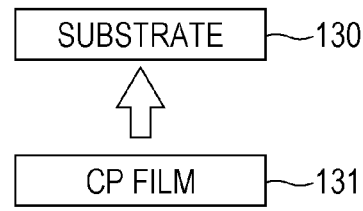
FIG. 15A is a schematic diagram illustrating a process until formation of display panel 10 is completed.

First, as illustrated in FIG. 15A, circular polarizing (CP) film 131 is laminated so as to entirely cover one of the main surfaces of substrate 130.

Figure 15B:
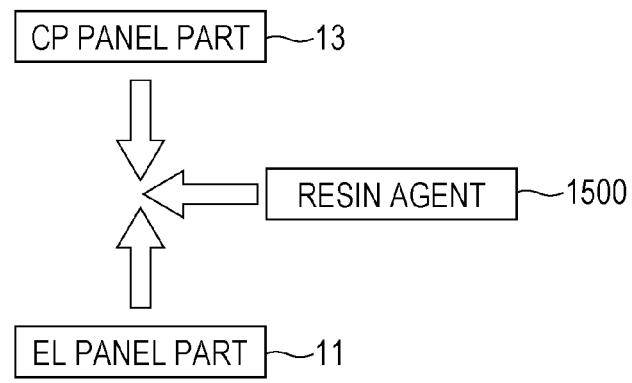
FIG. 15B is a schematic diagram illustrating a process until formation of display panel 10 is completed.

Next, as illustrated in FIG. 15B, EL panel part 11 and CP panel part 13 are laminated with sandwiched resin agent 1500.

Resin agent 1500 is a material for formation of resin layer 15, and for example, is a material obtained by dispersing and mixing a getter material (for example, synthetic zeolite) in an epoxy resin. Concentration of each material to be dispersed is within a range in which the above-described relationships are satisfied as resin layer 15. For example, the getter material is dispersed and mixed so as to have the concentration that ranges from 0.1 wt % to 10 wt %.

This lamination process is performed under a decompressed atmosphere to prevent air bubbles from remaining between EL panel part 11 and resin agent 1500, and between CP panel part 13 and resin agent 1500.

Resin agent 1500 may be coated on one of EL panel part 11 and CP panel part 13, and may be coated on both.

Figure 15C:
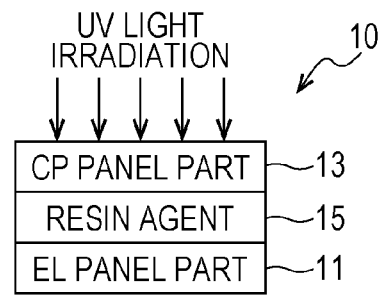
FIG. 15C is a schematic diagram illustrating a process until formation of display panel 10 is completed.

Next, as illustrated in FIG. 15C, the atmosphere transitions from a decompressed state to an atmospheric pressure state, and resin agent 1500 is irradiated with ultraviolet rays for curing. Resin agent 1500 is cured into resin layer 15, and thus lamination of EL panel part 11 and CP panel part 13 is completed.

In the present exemplary embodiment, as an example of resin agent 1500 for formation of resin layer 15, an epoxy resin with dispersed granular getter materials is used. In the epoxy resin, a cationic polymerization reaction occurs due to irradiation with ultraviolet rays. Since the synthetic zeolite contained as getter particles 151 is nonpolar even at a time of such a cationic polymerization reaction, the epoxy resin does not inhibit curing, maintains curing speed, and is preferable from a viewpoint of high working efficiency.

On the other hand, using materials such as an alkaline metal and an alkaline-earth metal as a material for the particles may become a cause for delaying the reaction during resin curing. Therefore, using the particles made of these materials is not preferable from the viewpoint of working efficiency.

As the resin material, not only materials curable by irradiation with light such as ultraviolet rays, but also the thermosetting resin curable through application of heat may be employed. Even in a case where the thermosetting resin is employed in this way, using synthetic zeolite as a material for getter particles 151 as in the present exemplary embodiment, or using other materials, such as an aluminum oxide, phosphorus oxide, and silica gel, does not delay the speed of curing. This is because a nonpolar material is used for forming getter particles 151.

Second Exemplary Embodiment

A structure of display panel 30 according to a second exemplary embodiment of the present disclosure will be described with reference to FIG. 16. Note that, in FIG. 16, identical reference numerals are used to denote identical portions in the above first exemplary embodiment, and no further description will be made thereon.

Figure 16:
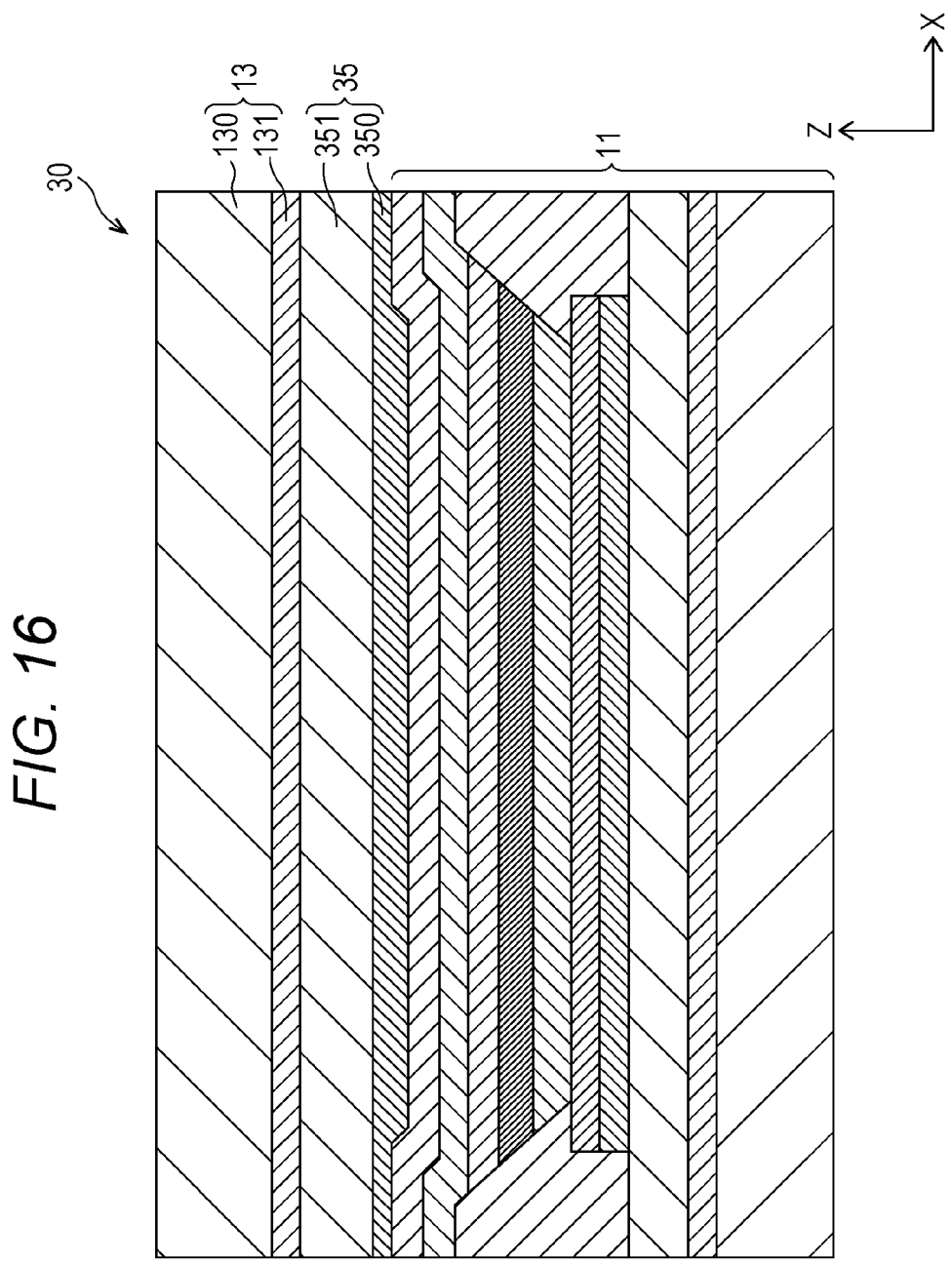
FIG. 16 is a schematic sectional view illustrating a structure of display panel 30 according to a second exemplary embodiment of the present disclosure.

As illustrated in FIG. 16, also in display panel 30 according to the present exemplary embodiment, EL panel part 11 and CP panel part 13 are joined by resin layer 35 disposed between EL panel part 11 and CP panel part 13. In display panel 30 according to the present exemplary embodiment, resin layer 35 is divided into two layers in a Z-axis direction. Specifically, resin layer 35 has a laminated structure of first resin element layer 351 disposed on a CP panel part 13 side (upper side of the Z-axis direction) and second resin element layer 350 disposed on an EL panel part 11 side (lower side of the Z-axis direction).

Between two layers 350, 351 that form resin layer 35, first resin element layer 351 includes only a resin part. The resin part may be formed through employment of a resin material identical to the material that forms above resin part 150.

On the other hand, second resin element layer 350 includes a resin part and a plurality of getter particles in the resin part as in resin layer 15 described above. Particle sizes (D50, D10, D90) of the getter particles are as described in the first exemplary embodiment. In addition, a density of the getter particles in second resin element layer 350 is also as described in the first exemplary embodiment. Specifically, the getter particles are dispersed at the density at which the getter particles do not overlap one another in plan view.

As in the present exemplary embodiment, the two-layer structure of resin layer 35 including first resin element layer 351 and second resin element layer 350 may relieve influence, on resin curing, of a material for the getter particles dispersed in second resin element layer 350. That is, the two-layer structure of resin layer 35 and thin second resin element layer 350 in which getter particles are dispersed may inhibit the influence on curing speed. In addition, thin second resin element layer 350 is preferable for implementing single scattering. Inserting first resin element layer 351 makes it possible to secure junction strength between EL panel part 11 and CP panel part 13, and to obtain a margin during manufacturing.

In addition, disposing second resin element layer 350 on an EL panel part 11 side of first resin element layer 351 makes it possible to inhibit degradation of an organic layer caused by outgas from first resin element layer 351 made of only resin materials.

Volume balance of first resin element layer 351 and second resin element layer 350 in resin layer 35 may be determined in view of an assumed amount of water and oxygen to be inhibited, and light transparency to be obtained.

Third Exemplary Embodiment

A structure of display panel 40 according to a third exemplary embodiment of the present disclosure will be described with reference to FIG. 17. Note that, in FIG. 17, identical reference numerals are used to denote identical portions in the above first exemplary embodiment, and no further description will be made thereon.

Figure 17:
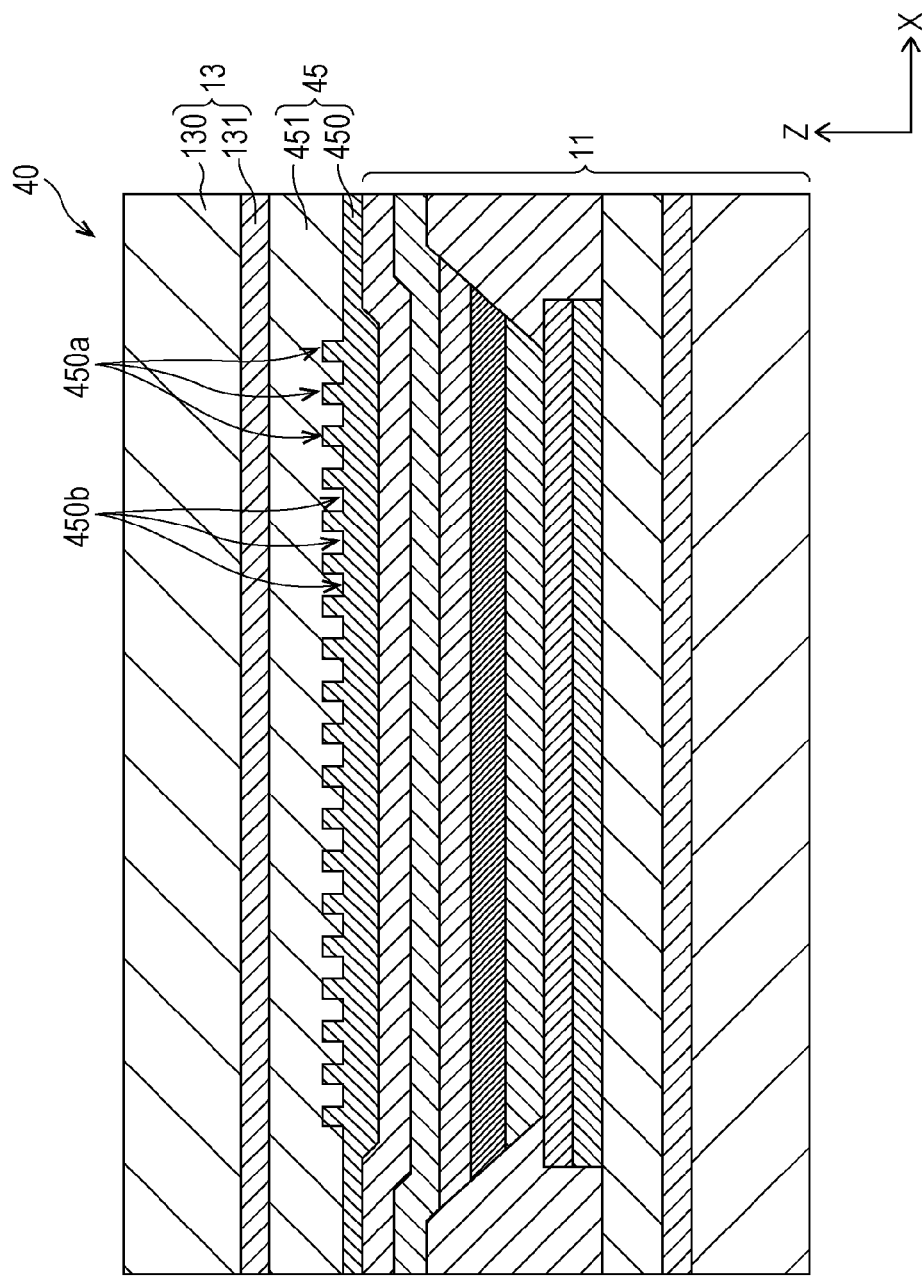
FIG. 17 is a schematic sectional view illustrating a structure of display panel 40 according to a third exemplary embodiment of the present disclosure.

As illustrated in FIG. 17, also in display panel 40 according to the present exemplary embodiment, resin layer 45 disposed between EL panel part 11 and CP panel part 13 has a laminated structure of first resin element layer 451 and second resin element layer 450.

The present exemplary embodiment differs from the above second exemplary embodiment in that a surface on a light-emitting side of second resin element layer 450 (upper side of a Z-axis direction) has an uneven structure where protrusion 450a and recess 450b continue. This surface of second resin element layer 450 having periodic the uneven structure is called a photonic crystal (PC) structure or a photonic band gap (PBG) structure. The PC structure and the PBG structure have, for example, a function to reflect and transmit a specific wavelength selectively with the periodic structure that appears at intervals of an order of μm.

When the surface of second resin element layer 450 has such an uneven structure, in addition to above-described optical effects by the getter particles in second resin element layer 450, a light scattering effect by the uneven structure on the surface of second resin element layer 450 may also be obtained, which is effective from a viewpoint of prevention of dark dots.

This also makes it possible, in the present exemplary embodiment, to obtain effects achieved by display panel 30 according to the above second exemplary embodiment.

The uneven structure on the surface of second resin element layer 450 is not limited to the structure of a rectangular cross-section as illustrated in FIG. 17. A structure of a triangular cross-section and a structure where unevenness of random cross-sectional size and random cross-sectional shape continue may also be used.

Fourth Exemplary Embodiment

A structure of display panel 50 according to a fourth exemplary embodiment of the present disclosure will be described with reference to FIG. 18. Note that, in FIG. 18, identical reference numerals are used to denote identical portions in the above first and second exemplary embodiments, and no further description will be made thereon.

Figure 18:
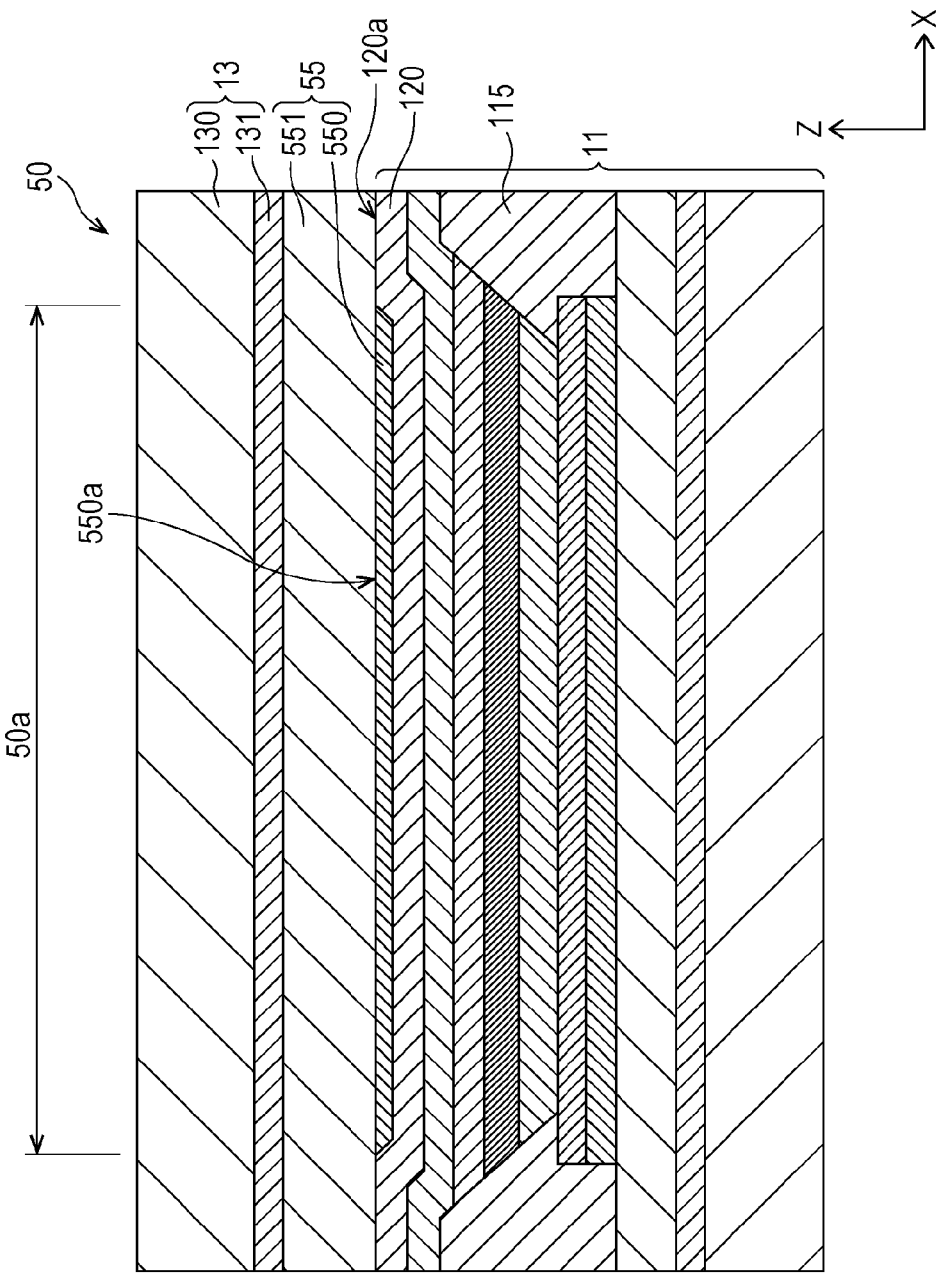
FIG. 18 is a schematic sectional view illustrating a structure of display panel 50 according to a fourth exemplary embodiment of the present disclosure.

As illustrated in FIG. 18, also in display panel 50 according to the present exemplary embodiment, resin layer 55 disposed between EL panel part 11 and CP panel part 13 has a laminated structure of first resin element layer 551 and second resin element layer 550.

The present exemplary embodiment differs from the above second exemplary embodiment in that second resin element layer 550 is formed in a region between adjacent banks 115, and that surface portion 120a of sealing layer 120 above a top surface of banks 115 is in contact with first resin element layer 551. In other words, second resin element layer 550 exists in a region corresponding to subpixel 50a, and upper surface 550a of second resin element layer 550 is positioned flush with or below surface portion 120a corresponding to the top surface of banks 115 in sealing layer 120.

In this way, a reduced layer thickness of second resin element layer 550 compared with the above second exemplary embodiment makes it possible to make sure that single scattering occurs, to achieve reduction in volume, to achieve reduction in material costs accordingly, and to improve working efficiency in manufacturing.

In addition, in the present exemplary embodiment, since second resin element layer 550 does not continue between adjacent subpixels 50a, even if a crack occurs in some portion of second resin element layer 550, the crack can be prevented from spreading to wide region in the panel.

This also makes it possible, in the present exemplary embodiment, to obtain effects achieved by display panel 30 according to the above second exemplary embodiment.

Fifth Exemplary Embodiment

A structure of display panel 60 according to a fifth exemplary embodiment of the present disclosure will be described with reference to FIG. 19. Note that, in FIG. 19, identical reference numerals are used to denote identical portions in the above first, second and fourth exemplary embodiments, and no further description will be made thereon.

Figure 19:
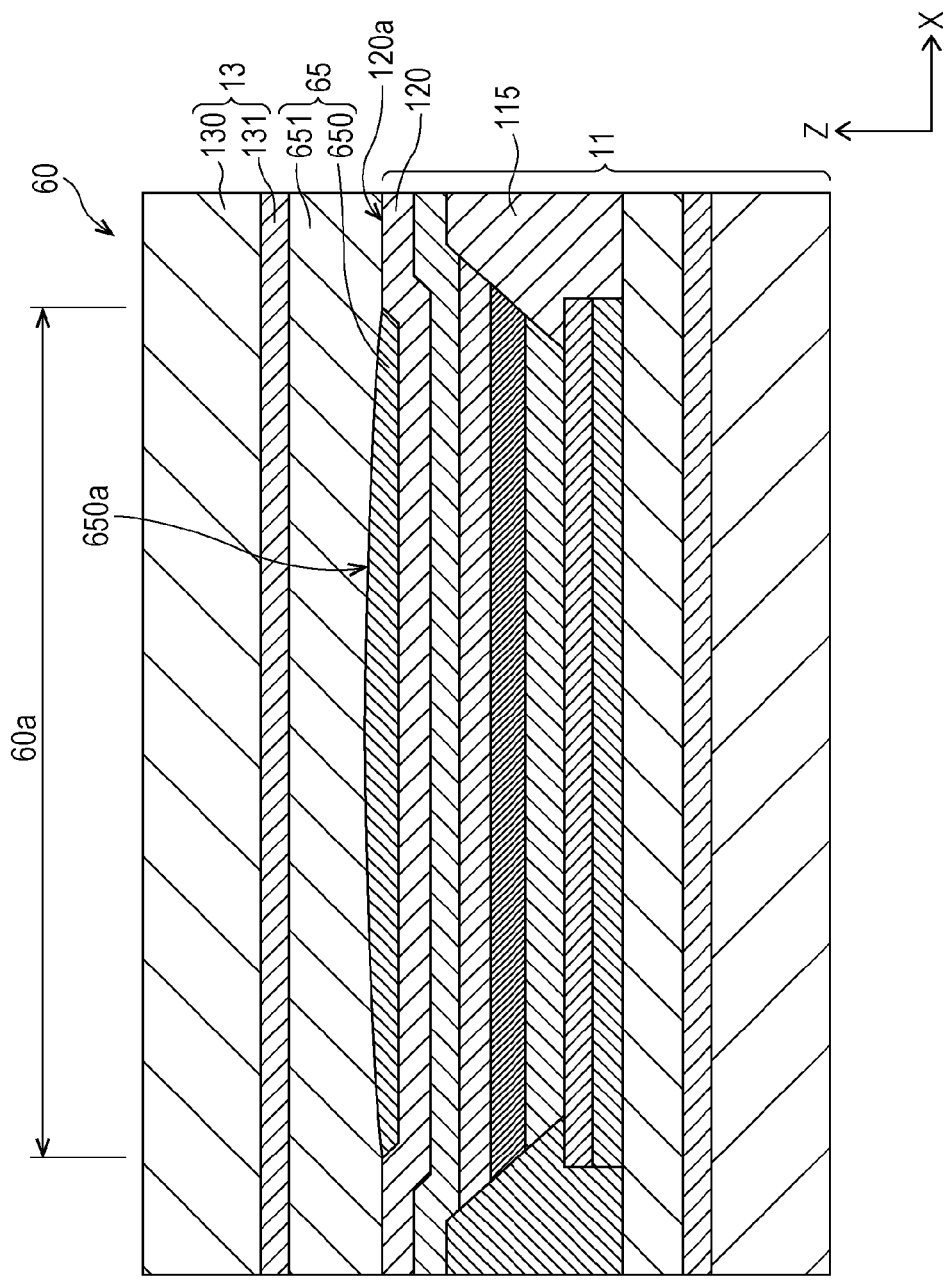
FIG. 19 is a schematic sectional view illustrating a structure of display panel 60 according to a fifth exemplary embodiment of the present disclosure.

As illustrated in FIG. 19, also in display panel 60 according to the present exemplary embodiment, resin layer 65 disposed between EL panel part 11 and CP panel part 13 has a laminated structure of first resin element layer 651 and second resin element layer 650.

The present exemplary embodiment differs from the above second exemplary embodiment in that second resin element layer 650 is formed in a region between adjacent banks 115, and that surface portion 120a of sealing layer 120 above a top surface of banks 115 is in contact with first resin element layer 651.

In resin layer 65 according to the present exemplary embodiment, upper surface 650a of second resin element layer 650 is arcuate protruding upward in a Z-axis direction. An uppermost portion, in the Z-axis direction, of upper surface 650a of second resin element layer 650 may be positioned more upward in the Z-axis direction than surface portion 120a of sealing layer 120, and may be at generally equal position.

In the present exemplary embodiment with upper surface 650a of second resin element layer 650 being arcuate protruding upward in this way, emitted light spreads slightly to a nonluminous region between subpixels 60a, which prevents users from noticing the nonluminous region as a whole panel.

This also makes it possible, in the present exemplary embodiment, to obtain effects achieved by display panel 30 according to the above second exemplary embodiment.

[First Variation]

While the above first to fifth exemplary embodiments have not mentioned the bank structure in detail, the structure as illustrated in FIG. 20A may be employed as an example.

As illustrated in FIG. 20A, display panel 70 according to First variation includes a plurality of first banks 715 each drawn in a Y-axis direction, and a plurality of second banks 721 each drawn in an X-axis direction. First banks 715 are laminated on upper surfaces of second banks 721.

In display panel 70 according to the present variation, regions surrounded by the pair of adjacent first banks 715 and the pair of adjacent second banks 721 are regions corresponding to subpixels 70a to 70c, respectively.

Employing the so-called line bank structure having such a structure facilitates securing flatness of organic films and provides high display quality.

[Second Variation]

As illustrated in FIG. 20B, in display panel 80 according to Second variation, bank 815 is integrally formed of a plurality of first bank elements 815a each drawn in the Y-axis direction, and a plurality of second bank elements 815b each drawn in the X-axis direction. Regions surrounded by a pair of adjacent first bank elements 815a and a pair of adjacent second bank elements 815b are regions corresponding to subpixels 80a to 80c.

Employing so-called pixel bank structure having such structure hardly causes a problem of cross-talk among subpixels 80a to 80c, and provides high display quality.

[Consideration of the Getter Particles in the Resin Layer]

The above-described first to fifth exemplary embodiments have described, as an example, the structure in which getter particles 151 are dispersed in at least some region in resin layers 15, 35, 45, 55, and 65. The getter particles to be dispersed in the resin layer that is a coating layer of EL panel part 11 will be considered below.

(Material for the Particles)

In the above-described first to fifth exemplary embodiments, particles formed of synthetic zeolite (5A) are employed as an example. However, the present disclosure does not limit the material for the getter particles to this example. Besides synthetic zeolite, each of the particles may be formed of a material selected from the group consisting of aluminum oxide, calcium chloride, calcium oxide, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride.

The material for the getter particles to be dispersed in the resin layer is not limited to one type. A plurality of types of particles formed of materials different from one another may be dispersed, in consideration of getter characteristic, light scattering characteristic, etc.

(Particle Size)

In the first to fifth exemplary embodiments, getter particles 131 having distribution as illustrated in FIG. 7 are dispersed in resin layers 15, 35, 45, 55, and 65 as an example. In the present disclosure, however, similar effects can be obtained when the average particle size D50 is within a range from not less than 0.4 μm to not more than 10 μm.

(Density of the Particles)

In the above-described first exemplary embodiment, as an example, a density of the getter particles in resin layer 15 is 0.1 wt % or more so that a total surface area per 1 cm² may be 0.2 cm² or less. However, the density of the getter particles is not limited to this example, and may be a density at which the getter particles do not overlap one another in plan view.

In addition to light scattering characteristic and getter characteristic, the concentration of getter particles is closely related to phenomena such as crack occurrence and cloudiness in the resin layer. Therefore, the concentration of getter particles may also be specified in detail as follows, in view of preferential characteristic.

[Other Matters]

The above-described first to fifth exemplary embodiments and variations 1 and 2 are applied to display panels 10, 30, 40, 50, 60, 70, and 80 as an example of the organic light-emitting device, but the present disclosure is not limited to this example. For example, the structure of the present disclosure is also applicable to organic EL lighting, etc.

The above-described first to fifth exemplary embodiments employ active-matrix display panels 10, 30, 40, 50, 60, 70, and 80, but the present disclosure is not limited to this example. For example, the above-described first to fifth exemplary embodiments and variations 1 and 2 are also applicable to passive-matrix display panels.

As illustrated in FIG. 4 and other diagrams, in the above-described first and other exemplary embodiments, a combination of three subpixels 10a to 10c each having a rectangular shape in plan view forms one pixel. However, the shape of each subpixel in plan view and a number of subpixels that form one pixel are not limited to this example. For example, the shape of each subpixel in plan view may be a triangle, a hexagon, and an octagon, and may be a honeycomb shape as a whole. The number of subpixels that form one pixel may be four, and may also be four or more. In this case, the subpixels that form one pixel may have luminous colors different from one another, and some subpixels may emit light in identical color.

In addition, resin layers 15, 35, 45, 55, 65 having the above structure may be disposed in another region. For example, when a resin substrate, etc. is employed as a substrate for EL panel part 11, resin layers 15, 35, 45, 55, 65 may be disposed between the resin substrate and the TFT layer. Employing such a structure makes it possible, for example, to protect the semiconductor layer from substances such as water and oxygen from outside, and outgas, even if an organic semiconductor is used as the semiconductor for the TFT layer.

In the above-described first to fifth exemplary embodiments, the size of the getter particles to be dispersed in resin layers 15, 35, 45, 55, 65 is specified with the particle size. However, the particle size may be measured using the dynamic light scattering method (laser light scattering method), for example. The particle size can be, of course, measured using another measuring method, and in this case, it is possible to confirm that the particle size is within specified range by conversion.

An external shape of the getter particles does not need to be perfectly spherical. In this case, it is possible to confirm that the particles are within the above range of the particle size by, for example, conversion into volume or a surface area.

The present disclosure is useful in achieving organic light-emitting devices and organic display apparatuses that have high light-emission quality.

REFERENCE SINGS LIST 1 organic EL display apparatus
10, 20, 30, 40, 50, 60, 70, 80 display panel
10a, 10b, 10c, 50a, 60a, 70a, 70b, 70c, 80a, 80b, 80c subpixel
11 EL panel part
13 CP panel part
15, 35, 45, 55, 65 resin layer
20 drive-control circuit part
21 to 24 drive circuit
25 control circuit
110, 130 substrate
111 TFT layer
112 insulating layer 113 anode
114 hole injection layer
115, 815 bank
116 hole transport layer
117 organic luminous layer
118 electron transport layer
119 cathode
120 sealing layer
131 circular polarizing film
150 resin part
151 getter particle
350, 450, 550, 650 first resin element layer
351, 451, 551, 651 second resin element layer
450a protrusion
450b recess
715 first bank
721 second bank
815a first bank element
815b second bank element
1500 resin agent

What is claimed is:

1. An organic light-emitting device comprising:
a first panel;
a second panel disposed to face the first panel with a gap between the first panel and the second panel; and
a coating layer inserted between the first panel and the second panel so as to contact the first panel and the second panel,
wherein
the first panel comprises a first substrate and a luminous part formed on one of main surfaces of the first substrate, the luminous part comprising an organic layer in structure and emitting light opposite to the first substrate,
the second panel comprises a second substrate and a circular polarizing film disposed in a region through which the light emitted from the luminous part of the first panel passes,
the coating layer comprises a resin part that transmits the light emitted from the luminous part and a plurality of particles dispersed in a portion of the resin part,
each of the plurality of particles is formed of a material selected from the group consisting of synthetic zeolite, aluminum oxide, calcium chloride, calcium oxide, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride,
an average particle size D50 of the plurality of particles is set in a range equal to or greater than a value of the particle size parameter at which the scattering efficiency becomes maximum, wherein the particle size diameter equals $\pi D/(\lambda/n)$, wherein D is a particle size and n is a refractive index,
a layer thickness of the coating layer is not less than 10 μm and not more than 20 μm, and
the plurality of particles in the resin part are dispersed at a density at which the particles do not overlap one another when the second panel is viewed in plan view.

2. The organic light-emitting device according to claim 1, wherein the plurality of particles in the coating layer are dispersed in the portion of the resin part at a density at which a total surface area per 1 $cm^2$ is 0.2 $cm^2$ or less.

3. The organic light-emitting device according to claim 1, wherein the circular polarizing film is disposed to cover a main surface on a first panel side of the second substrate, and comprises a first main surface contacting the second substrate and a second main surface contacting the coating layer.

4. The organic light-emitting device according to claim 1, wherein an average particle size D50 of the plurality of particles satisfies a relationship of 0.4 μm≤D50≤10 μm.

5. The organic light-emitting device according to claim 1, wherein an average particle size D50 of the plurality of particles satisfies a relationship of 3 μm≤D50≤10 μm.

6. The organic light-emitting device according to claim 1, wherein
a refractive-index ratio of the plurality of particles to the resin part is 1.3 or more, and
an average particle size D50 of the plurality of particles is 0.5 μm or more.

7. An organic display apparatus comprising:
a display panel; and
a control-drive circuit connected to the display panel,
wherein
the display panel is an organic light-emitting device comprising:
a first panel;
a second panel disposed to face the first panel with a gap between the first panel and the second panel; and
a coating layer inserted between the first panel and the second panel so as to contact the first panel and the second panel, wherein
the first panel comprises a first substrate and a luminous part formed on one of main surfaces of the first substrate, the luminous part comprising an organic layer in structure and emitting light opposite to the first substrate,
the second panel comprises a second substrate and a circular polarizing film disposed in a region through which the light emitted from the luminous part of the first panel passes,
the coating layer comprises a resin part that transmits the light emitted from the luminous part and a plurality of particles dispersed in a portion of the resin part,
each of the plurality of particles is formed of a material selected from the group consisting of synthetic zeolite, aluminum oxide, calcium chloride, calcium oxide, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride,
an average particle size D50 of the plurality of particles is set in a range equal to or greater than a value of the particle size parameter at which the scattering efficiency becomes maximum, wherein the particle size diameter equals $\pi D/(\lambda/n)$, wherein D is a particle size and n is a refractive index,
a layer thickness of the coating layer is not less than 10 μm and not more than 20 μm, and
the plurality of particles in the resin part are dispersed at a density at which the particles do not overlap one another when the second panel is viewed in plan view.

* * * * *